(12) United States Patent
Majumder et al.

(10) Patent No.: US 10,133,841 B1
(45) Date of Patent: Nov. 20, 2018

(54) METHODS, SYSTEMS, AND COMPUTER PROGRAM PRODUCT FOR IMPLEMENTING THREE-DIMENSIONAL INTEGRATED CIRCUIT DESIGNS

(71) Applicant: Cadence Design Systems, Inc., San Jose, CA (US)

(72) Inventors: Chayan Majumder, Noida (IN); Arnold Ginetti, Antibes (FR); Chandra Prakash Manglani, Noida (IN); Amit Kumar, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 97 days.

(21) Appl. No.: 15/282,792

(22) Filed: Sep. 30, 2016

(51) Int. Cl.
*G06F 17/50* (2006.01)

(52) U.S. Cl.
CPC ...... *G06F 17/5077* (2013.01); *G06F 17/5081* (2013.01)

(58) Field of Classification Search
CPC .................. G06F 17/5077; G06F 17/5081
See application file for complete search history.

(56) References Cited

U.S. PATENT DOCUMENTS

| | | | |
|---|---|---|---|
| 6,378,116 B1 | 4/2002 | Ginetti | |
| 6,405,345 B1 | 6/2002 | Ginetti | |
| 6,519,743 B1 | 2/2003 | Nauts et al. | |
| 6,622,290 B1 | 9/2003 | Ginetti et al. | |
| 6,622,291 B1 | 9/2003 | Ginetti | |
| 7,555,739 B1 | 6/2009 | Ginetti et al. | |
| 7,634,743 B1 | 12/2009 | Ginetti | |
| 7,949,987 B1 | 5/2011 | Ginetti et al. | |
| 7,971,175 B2 | 6/2011 | Ginetti et al. | |
| 7,971,178 B1 | 6/2011 | Marwah et al. | |
| 8,046,730 B1 | 10/2011 | Ferguson et al. | |
| 8,255,845 B2 | 8/2012 | Ginetti | |
| 8,271,909 B2 | 9/2012 | Majumder et al. | |
| 8,281,272 B1 | 10/2012 | Ginetti | |
| 8,312,398 B2 | 11/2012 | Majumder et al. | |
| 8,392,870 B2 * | 3/2013 | Zhang .................. | G06F 17/505 716/119 |
| 8,453,136 B1 | 5/2013 | Hahn et al. | |
| 8,490,038 B1 | 7/2013 | Arora et al. | |
| 8,572,532 B1 | 10/2013 | Singh et al. | |
| 8,594,988 B1 | 11/2013 | Spyrou et al. | |

(Continued)

FOREIGN PATENT DOCUMENTS

WO  WO2009070177 A1  6/2009

OTHER PUBLICATIONS

Ahn, Byung-Gyu, et al. "Effective estimation method of routing congestion at floorplan stage for 3D ICs." JSTS: Journal of Semiconductor Technology and Science 11.4 (2011): 344-350.

(Continued)

*Primary Examiner* — Naum B Levin
(74) *Attorney, Agent, or Firm* — Vista IP Law Group, LLP

(57) ABSTRACT

Disclosed are techniques for implementing three-dimensional or multi-layer integrated circuit designs. These techniques identify an electronic design and a plurality of inputs for implementing connectivity for the electronic design. Net distribution results may be generated at least by performing one or more net distribution analyzes. A bump in a bump array may then be assigned to a net that connects a first layer and a second layer in the electronic design based in part or in whole upon the net distribution analysis results.

20 Claims, 22 Drawing Sheets

(56) References Cited

U.S. PATENT DOCUMENTS

| | | | |
|---|---|---|---|
| 8,640,078 | B2 | 1/2014 | Majumder et al. |
| 8,711,177 | B1 | 4/2014 | Majumder et al. |
| 8,719,754 | B1 | 5/2014 | Ginetti |
| 8,769,455 | B1 | 7/2014 | Singh et al. |
| 8,806,405 | B2 | 8/2014 | Colwell et al. |
| 8,910,100 | B1 | 12/2014 | Wilson et al. |
| 8,977,995 | B1 | 3/2015 | Arora et al. |
| 9,092,586 | B1 | 7/2015 | Ginetti et al. |
| 9,122,384 | B1 | 9/2015 | Kohli et al. |
| 9,141,746 | B1 | 9/2015 | Ginetti et al. |
| 9,280,621 | B1 | 3/2016 | Ginetti et al. |
| 9,619,605 | B1 | 4/2017 | Kohli et al. |
| 9,672,308 | B1 | 6/2017 | Majumder |
| 9,761,204 | B1 | 9/2017 | Ginetti et al. |
| 9,779,193 | B1 | 10/2017 | Ginetti et al. |
| 9,798,840 | B1 | 10/2017 | Ginetti |
| 2010/0115207 | A1 | 5/2010 | Arora et al. |
| 2010/0205575 | A1 | 8/2010 | Arora et al. |
| 2010/0287493 | A1 | 11/2010 | Majumder et al. |
| 2011/0061034 | A1 | 3/2011 | Ginetti et al. |
| 2011/0131525 | A1 | 6/2011 | Majumder et al. |
| 2011/0131543 | A1 | 6/2011 | Majumder et al. |
| 2011/0131544 | A1 | 6/2011 | Majumder et al. |
| 2011/0161899 | A1 | 6/2011 | Ginetti et al. |
| 2011/0185323 | A1* | 7/2011 | Hogan ................ G06F 17/5081 716/52 |
| 2011/0219352 | A1 | 9/2011 | Majumder et al. |
| 2012/0047434 | A1 | 2/2012 | Ginetti |
| 2012/0201068 | A1* | 8/2012 | Ware ........................ G11C 5/04 365/63 |
| 2013/0246900 | A1 | 9/2013 | Ginetti et al. |
| 2013/0290834 | A1 | 10/2013 | Ginetti et al. |
| 2015/0009743 | A1* | 1/2015 | Chung ................ G11C 29/028 365/96 |

\* cited by examiner

METHODS, SYSTEMS, AND COMPUTER PROGRAM PRODUCT FOR IMPLEMENTING THREE-DIMENSIONAL INTEGRATED CIRCUIT DESIGNS

BACKGROUND

More recent electronic designs include three-dimensional integrated circuit designs (3DIC) or pseudo-three-dimensional (2.5D) integrated circuit designs where dies are arranged in an out-of-plane direction. These integrated circuit (IC) dies and shapes therein need to be properly aligned and arranged with respect to each other in order for the end product to function correctly or as intended. Even a single die design may include multiple metal layers, whereas conventional EDA tools present each metal layer of these multiple metal layers as an editable layer. Interconnecting these multiple layers or multiple dies has been severely cumbersome in that conventional approaches often load the layout of one layer (in a multi-layer, single die design) or one die (in a multi-die design) having the requisite interconnecting terminals or pins. These conventional approaches then identify the interconnects (e.g., bump pads interfacing with another die through a bump array, through-silicon vias interfacing another adjacent layer, etc.) on the layer or the die and implement the inter-die or inter-layer connectivity based on the design data provided by the layout of the layer or the die. Once the connectivity between these interconnects and the layer or die is completed. These conventional approaches then load another layout of another layer or die as well as the interconnects.

For example, in a three-dimensional (3D) integrated circuit (IC) design having a first die design stacking on top of a second die design, conventional approaches often load one die design (e.g., the first die) and the bump pads, which correspond to a bump array interfacing both the first and second die designs, to determine the connectivity between the two die designs via a bump array. More specifically, these conventional approaches load the layout of the first die and the bump pads and determine which bump pads will be assigned to what terminals or pins of the first die design. Once the connectivity is determined for the first die design, these conventional approaches then load the layout of the second die design and the bump pads, which also correspond to the same bump array, and attempt to connect the bump pads to the terminals or pins in the second die design.

Often, the connectivity implemented this way is improved or even optimized only between the bump array and the first layer or the die that is first loaded. On the other hand, the connectivity between the second layer or die design and the bump array is often much less improved and difficult to implement because the bumps in the bump array have already been assigned to certain terminals of the first layer or die design, and such assignment has been implemented without accounting for the information of the second layer or die design. As a result, conventional approaches may require numerous rounds of iterations to change the assignment of bumps in a bump array to corresponding terminals or pins so as to finally achieve a proper connectivity for the integrated circuit design.

Therefore, there exists a need for a method, system, and computer program product for implementing three-dimensional or multi-layer integrated circuit designs to address at least the aforementioned shortcomings and to implement integrated circuit designs in a much more efficient manner as far as at least time and computational resource utilizations are concerned.

SUMMARY

Disclosed are method(s), system(s), and article(s) of manufacture for implementing three-dimensional or multi-layer integrated circuit designs in various embodiments. It shall be noted that although various embodiments refer to three-dimensional integrated circuit (3D IC) designs, the techniques described herein are not only limited to 3D ICs and apply in full and equal effects to any multi-layer, single die electronic designs or multi-die IC designs, unless otherwise specifically claimed or specified.

Some embodiments are directed to a method for implementing three-dimensional or multi-layer integrated circuit designs. In these embodiments, an electronic design and a plurality of inputs for implementing connectivity for the electronic design may be identified. Net distribution results may be generated at least by performing one or more net distribution analyses. A bump in a bump array may then be assigned to a net that connects a first layer and a second layer in the electronic design based in part or in whole upon the net distribution analysis results.

In some embodiments, a first IC die design, a second IC die design, a plurality of nets, and the bump array may be identified; a first net may be identified from the plurality of nets; a first terminal in the first IC die design may be identified based in part or in whole upon inter-die connectivity for the first net; and a second terminal in the second IC die design may be identified based in part or in whole upon inter-die connectivity for the first net. In some of these embodiments, a first bounding box may be determined for the first terminal based in part or in whole upon first intra-die connectivity for the first terminal and a second bounding box for the second terminal based in part or in whole upon second intra-die connectivity for the second terminal.

In addition or in the alternative, the first intra-die connectivity may be identified for the first terminal; one or more first logic pins and one or more first nets corresponding to the first terminal may be determined from the first intra-die connectivity; and the first bounding box may be determined for the first terminal based in part or in whole upon the one or more first logic pins and the one or more first nets.

In some embodiments, the second intra-die connectivity may be identified for the second terminal; one or more second logic pins and one or more second nets corresponding to the second terminal may be determined from the second intra-die connectivity; and the second bounding box may be determined for the second terminal based in part or in whole upon the one or more second logic pins and the one or more second nets.

In some of these embodiments, the first bounding box and the second bounding box in a single design space; and information about the bump array may be identified into the single design space. In some embodiments, a single design space including the first bounding box, the second bounding box, and information about the bump array may be identified, wherein the information about the bump array comprises geometric information of a plurality of bumps in the bump array or a plurality of bump pads corresponding to the plurality of bumps; a first net interconnecting a first electronic design in the electronic design and a second electronic design in the electronic design may be identified; a first terminal or a first logic pin corresponding to the first terminal and a second terminal or a second logic pin corresponding to the second terminal may be identified for the first net; and one or more candidate bumps or one or more candidate bump pads may be identified for the first net.

In some of these embodiments, respective first aggregated costs may be determined for the first net routed through the one or more candidate bumps or the one or more candidate bump pads for the first net; and a first bump or a first bump pad from the one or more candidate bumps or the one or more candidate bump pads may be determined based in part or in whole upon the respective first aggregated costs.

In some embodiments, one or more second bumps may be filtered out from the plurality of bumps or the plurality or one or more bump pads from the plurality of bump pads based in part or in whole upon the respective first aggregated costs; one or more first bumps may be filtered out from the bump array based in part or in whole upon congestion analysis results; or design data pertaining to inter-die interconnects between the first electronic design and the second electronic design in the electronic design may be ignored or excluded from further processing.

In some embodiments, a first bump may be identified for the net from the net distribution analysis results; and a determination may be made to decide whether the first bump has been assigned. In addition, the first bump may be identified to the bump in the bump array when the first bump is determined not to have been assigned; and the bump may then be assigned to the first net when the first bump is determined not to have been assigned.

In some embodiments, a second net to which the first bump has been assigned may be identified when the first bump is determined to have been assigned; the net distribution results pertaining to the second net and one or more first candidate bumps for the first net and one or more second candidate bumps for the second net may be identified. In some of these embodiments, a first aggregated cost may be determined for assigning the first bump to the first net; a second aggregated cost may be determined for assigning the first bump to the second net; and a determination may be made to decide whether the first aggregated cost is less than the second aggregated cost.

In some of these embodiments, a first candidate bump may be identified for the first net when the first aggregated cost is determined not to be less than the second aggregated cost; and the first candidate bump may be assigned to the first net when the first aggregated cost is determined not to be less than the second aggregated cost. In addition or in the alternative, a second candidate bump may be identified for the second net when the first aggregated cost is determined to be less than the second aggregated cost; the first bump may be dissociated with the second net; the second candidate bump may be assigned to the second net; and the first bump may be assigned to the first net.

Some embodiments are directed at one or more hardware modules that include and/or function in conjunction with at least one micro-processor as well as other related components or architectures of one or more computing systems and may be invoked to perform any of the methods, processes, or sub-processes disclosed herein. The hardware system may include one or more variants of a bounding box module, a projection module, an analysis module, an implementation module, an assignment module, and/or a cost module in some embodiments.

Each of these modules may include or function in tandem with electrical circuitry and one or more micro-processors each having one or more processor cores to perform its intended functions. The hardware system may further include one or more forms of non-transitory machine-readable storage media or persistent storage devices to temporarily or persistently store various types of data or information, various design rules, various libraries, selected and selectable targets, or any other suitable information or data, etc. A module may be initialized in a computing system so that the software portion of the module is stored in memory (e.g., random access memory) to be executed by one or more processors or processor cores off the computing system to perform at least a part of the functionality of the module. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one micro-processor or at least one processor core, causes the at least one micro-processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for verifying connectivity of an electronic design are described below with reference to FIGS. 1-5B.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments are directed to a method, system, and computer program product for implementing three-dimensional or multi-layer integrated circuit designs. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Figure 1:
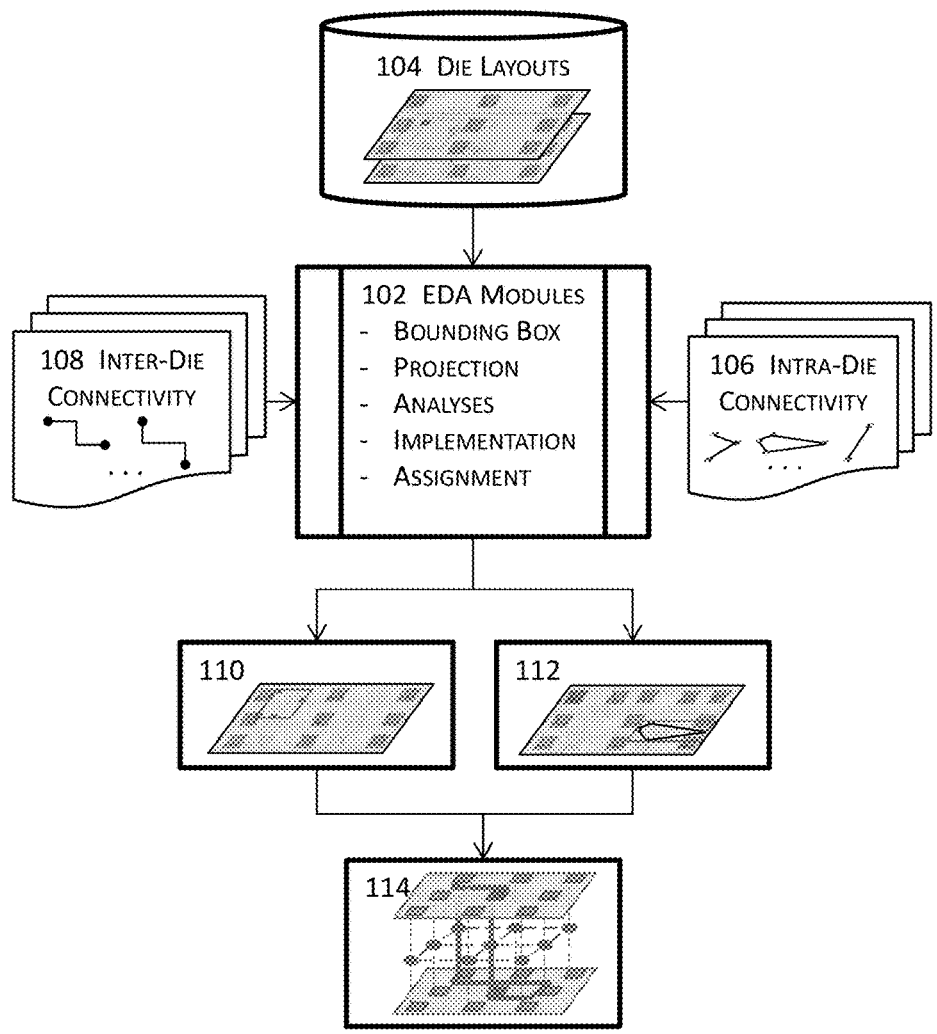
FIG. 1 illustrates a high level block diagram for implementing three-dimensional or multi-layer integrated circuit designs in one or more embodiments.

FIG. 1 illustrates a high level block diagram for implementing three-dimensional or multi-layer integrated circuit designs in one or more embodiments. In these embodiments, a plurality of electronic design automation (EDA) modules 102 receive and process various inputs (e.g., 104, 106, and 108) to implement inter-layer or inter-die connectivity (e.g., 110, 112, and 114). These inputs may include, for example, a multi-layer IC die layout or a multi-die IC layout 102, intra-die connectivity 106, and/or inter-die connectivity 108, etc. Intra-die connectivity 106 may be referenced in determining cross-layer or cross-die interconnections.

To achieve an overall lower cost and hence improved cross-die or cross-layer connectivity in assigning bumps in a bump array to nets that connect first terminals in a first die design and corresponding second terminals in a second die, these techniques described herein may consider the intra-die connectivity of both the first and second terminals so that the bump assignment for the net is determined as an improved or optimal solution with respect to both the first die design and the second die design in some embodiments.

In these embodiments, the cross-die or cross-layer connectivity is determined in such a way that is in sharp contrast with conventional approaches that only consider either the first die design or the second die design but not both the first and second die designs. As a result, these techniques described herein completely eliminate or at least reduce the difficulties of and the number of iterations in optimizing bump assignment with respect to only one terminal in one die design without considering the other die design and thus causing greater difficulties and often less than optimal or desirable results in completing the interconnection between the other terminal in another die design and the assigned bump.

As a working example of a 3D IC, various EDA modules 102 may receive die layouts 104 and a bump array for interconnecting a net that spans between, for example, a first die design and a second die design. It shall be noted that a 3D IC or 3D-IC described in various examples or embodiments may generally include, for example, 2.5D or 3D interposer based integration of integrated circuits, 3D stacked integrated circuits (3D-SICs), monolithic 3D ICs, 3D system integration, 3D heterogeneous integration, 3D wafer level packaging, etc. It shall be further noted that that although various examples described in this application refer to 3D ICs or 3D-ICs, these techniques apply with full and equal effects to any multi-layer, single die electronic designs or multi-die IC designs, unless otherwise specifically claimed or specified. In this example, the respective terminals in these two die designs may be identified from the inter-die connectivity 108 that further delineates how these two die designs are connected to each other. For example, the inter-die connectivity 108 may include the information of a first terminal in a first die design and a second terminal in a die design for the net of interest.

These EDA modules 102 may further receive intra-die connectivity 106 for the first terminal and that for the second terminal. Intra-die connectivity may include, for example, connectivity information within an IC die design. The intra-die connectivity associated with a terminal in a die design may be used to determine routing related information (e.g., routing demand, routing supply, congestion, design rule compliance, metal density, computational resource utilization, etc.) between the terminal and one or more bump pads that correspond to respective bumps in a bump array.

In determining which bump in the bump array is to be assigned to the net interconnecting the first and the second terminals, these techniques determine a first bounding box for the first terminal as shown in 110 and a second bounding box for the second terminal as shown in 112 based in part or in whole upon their respective intra-die connectivity 106. The two bounding boxes are then arranged in a single design space, and the bump interconnecting these two terminals is selected based on the intra-die connectivity for both the first die design and the second die design so that the selected bump may be optimized for both die designs. In selecting a particular bump from the bump array for the net of interest, these approaches may ignore the interconnect segments between the first and the second die designs to reduce the data size and hence the memory footprint to accommodate the data and the runtime to process the data.

For example, these two bounding boxes may be mapped to a single two-dimensional design space while the interconnect segments between these two die designs are ignored to reduce the data size. The design space may also include the bump pads that respectively correspond to the bumps in the bump array. With the bump pads and both bounding boxes in the same design space, a particular bump pad (and hence a particular bump) associated with the lowest overall cost may then be identified for the net of interest, and the net may then be routed via the particular bump as shown in 114. These techniques may then identify and process the next net interconnecting these two dies in an identical or a substantially similar manner until all nets interconnecting these two die designs are associated with their respective bumps in the bump array.

Unlike conventional approaches that select an optimal bump for a terminal in one die design without considering the other die design, these EDA modules 102 select the bump not only based upon the intra-die connectivity of one terminal in one die design but also upon the other terminal in another die design so that the overall cost in implementing the net to connect these two terminals is reduced or minimal. One of the advantages of these techniques is the complete elimination or reduction of iterations in determining the bump assignment for nets spanning across multiple dies and hence the conservation of computational resources (e.g., runtime, memory utilization, etc.)

Figure 2A:
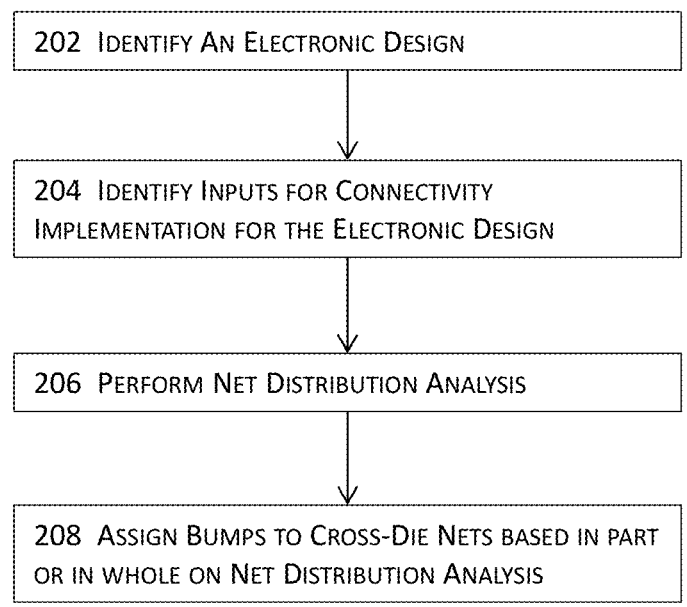
FIG. 2A illustrates a high level flow diagram for implementing three-dimensional or multi-layer integrated circuit designs in one or more embodiments.

FIG. 2A illustrates a high level flow diagram for implementing three-dimensional or multi-layer integrated circuit designs in one or more embodiments. An electronic design may be identified at 202. It shall be noted that although some embodiments and drawing figures refer to 3D IC designs, these techniques described herein are not only limited to 3D ICs and apply in full and equal effects to any multi-layer, single die electronic designs or multi-die IC designs, unless otherwise specifically claimed or specified. Therefore, references to an electronic design may generally refer to any multi-layer, single die electronic designs or multi-die IC designs unless otherwise explicitly specified or recited as three-dimensional integrated circuit (3D IC) designs or multi-layer, single die electronic designs. In some embodiments where cross-die or cross-layer connectivity is to be determined, the electronic design identified at 202 may include the interface portion (e.g., terminals connecting to another layer or die design, logic pins corresponding to the terminals, nets or net segments at or around the terminals or logic pins, or any other information that may be needed or desired for implementing the cross-layer or cross-die interconnections, etc.), rather than the full physical design, of each of the multiple layers or multiple die designs. In these embodiments, design data of a layer or a die unrelated to the determination of the cross-layer or cross-die interconnections may be discarded, and the original full design data may be reduced into a reduced set of interface design data to conserve the memory needed to accommodate the design data as well as runtime to process the design data.

A plurality of inputs for the implementation of connectivity for the identified electronic design may be identified at 204. The plurality of inputs may include, for example but not limited to, intra-die connectivity describing how a single layer, a single die, or a portion thereof is connected within itself as well as what furnishes such interconnections, inter-die connectivity describing how multiple dies or layers are connected as well as what furnishes such interconnections, a bump array interfacing two immediately adjacent dies, the bump pads corresponding to the bump array, etc. in some embodiments.

A net distribution analysis may be performed at 206 to generate net distribution analysis data. A net distribution analysis may include one or more analyses performed on a net or net segment via specific bump or a pair of terminals or corresponding logic pins on two separate layers or die designs for the net or net segment that spans across two separate layers or die designs.

A net distribution analysis result may include, for example, various predicted or estimated cost information such as the predicted or estimated computational resource utilization to route the net or net segment through the specific bump, the predicted routing resource utilization to route the net or net segment through the specific bump, the predicted or estimated impact on at least a portion of the electronic design of routing the net or net segment through the specific bump, any other suitable predicted or estimated costs, or any combinations thereof.

For example, a predicted or estimated cost information may include an estimated length of a route between a pair of terminals through a specific bump, estimated or predicted congestion (e.g., routing resource used divided by routing resource supply in a region) of a route between a pair of terminals through a specific route, an estimated or predicted increase in congestion if a net or net segment is routed through a specific bump, relative congestion of one or more sub-regions through which the route via a specific bump passes, etc.

With the net distribution analysis results determined at 206, bumps in the bump array may be assigned at 208 to respective nets or net segments that interconnect multiple layers or multiple die designs. For example, a bump yielding the lowest predicted or estimated cost may be assigned to a net or net segment. As another example, a bump yielding lowest congestions or lowest combined cost in the two regions enclosing the two terminals or corresponding logic pins may be assigned to a net or net segment. In this manner, bump assignment may be accomplished based on both the first die design and the second die design, instead of based solely on one die design while another die design may suffer from a much higher cost or difficulties in connecting to the specific bump. A bump may generally refer to a bump ball that interfaces two IC die designs in some embodiments or a via that interfaces two layers of a multi-layer, single IC die design in some other embodiments.

Figure 2B:
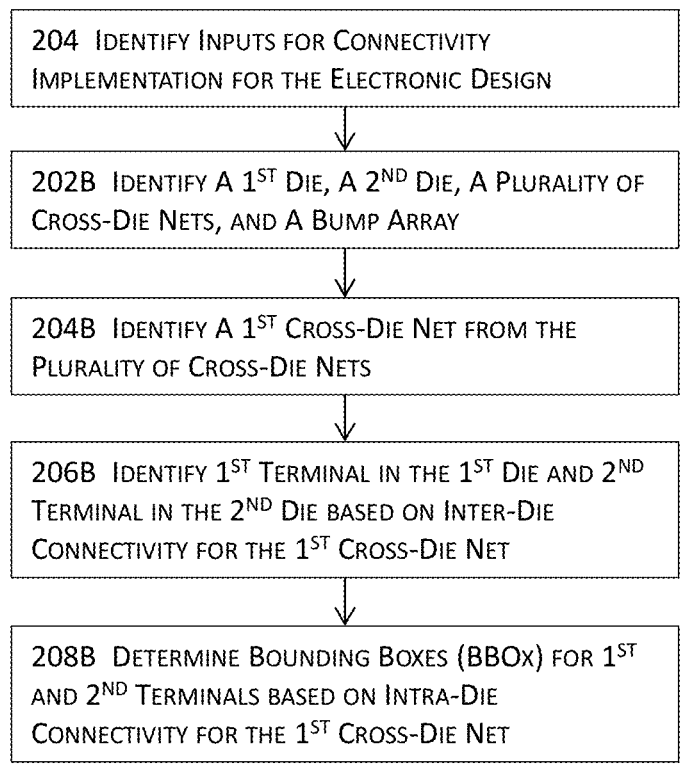
FIG. 2B illustrates more details of a block illustrated in FIG. 2A in some embodiments.

FIG. 2B illustrates more details of a block illustrated in FIG. 2A in some embodiments. More specifically, FIG. 2B illustrates more details about identifying a plurality of inputs at 204 of FIG. 2A. In these embodiments, a first die design, a second die design, a plurality of nets, and a bump array may be identified at 202B. In some embodiments, bump pads corresponding to the bump array in each of the first and second die design may be identified in addition to or in lieu of the bump array at 202B.

A plurality of nets connecting the first and second die designs may be identified, and a first net may be identified from the plurality of nets at 204B. Each of the plurality of nets connects a first terminal in a first electronic design with a second terminal in a second electronic design, and an electronic design may be a layout of a layer or a die, or a portion of such a layout.

The first terminal in the first electronic design and the second terminal in the second electronic design may be identified at 206B based in part or in whole upon connectivity. In some embodiments where the first and second electronic designs are layouts of the first and the second die designs, the first terminal in the first electronic design and the second terminal in the second electronic design may be identified at 206B based in part or in whole upon inter-die connectivity. Inter-die connectivity includes information about how two die designs are connected to each other and information about the circuit design components and the identifications thereof that furnish the interconnections between these two die designs. For example, inter-die connectivity may include the name of a net that connects a first terminal in a first die design and a second terminal in a second die design, the names of the net, the first terminal, and the second terminal. In some of these embodiments, the inter-die connectivity may further include information about the electronic circuit components along the net between the two terminals.

A bounding box may be determined at 208B for each terminal of the first and second terminals. A bounding box may be determined as a polygon that encloses the terminal and the logic pins corresponding to the terminal. In some embodiments, a bounding box may include the smallest rectangle enclosing the terminal and the logic pin(s) corresponding to the terminal. In some other embodiments, a bounding box may include the smallest rectangle enclosing the terminal and the logic pin(s) corresponding to the terminal plus a uniform offset or non-uniform offset. In some other embodiments, a bounding box may include the smallest polygon (convex or concave) enclosing the terminal and the logic pin(s) corresponding to the terminal plus zero offset, a uniform offset, or non-uniform offset. The bounding box determined at 208B for a terminal may include or associate with information about the intra-die connectivity so that the bounding box and the included or associated intra-die connectivity information may be subsequently used in determining or optimizing interconnections for the terminal. In some embodiments, a bounding box may also be determined to include one or more other nets or net segments that are in the vicinity of the terminal or the one or more corresponding logic pins. These one or more other nets or net segments may be included in the bounding box for the terminal because these one or more other nets or net segments occupy routing resources and thus may be referenced in determining the interconnection between the terminal and the other terminal.

Figure 2C:
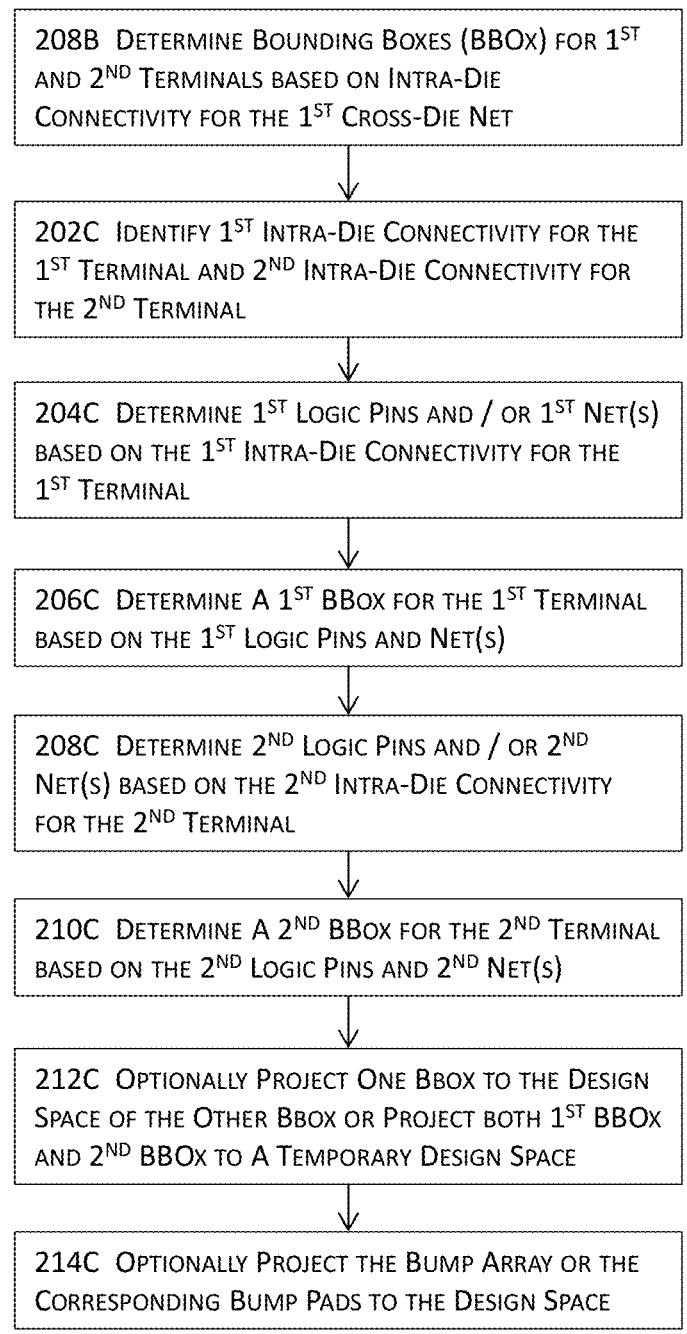
FIG. 2C illustrates more details of a block illustrated in FIG. 2B in some embodiments.

FIG. 2C illustrates more details of a block illustrated in FIG. 2B in some embodiments. More specifically, FIG. 2C illustrates more details about determining a bounding box at 208B of FIG. 2B. In these embodiments, a first intra-die connectivity for the first terminal and the second intra-die connectivity for the second terminal may be identified at 202C from a persistent connectivity database or a copy thereof. Intra-die connectivity for a terminal provides information for the interconnections to, from, or around the terminal and its corresponding logic pin(s). One or more logic pins may correspond to a terminal or pin that is the physical component in the electronic design. For example, a terminal such as a physical power supply pin may be connected to a power supply net that transmits power from the physical power supply pin to the connected circuit components or devices. These connected circuit components may connect to one or more points along the net, and these points may be considered one or more logic pins corresponding to the terminal.

One or more first logic pins and/or one or more first nets may be identified at 204C based in part or in whole upon the first intra-die connectivity for the first terminal. As explained above, the first intra-die connectivity includes the information provides information for the interconnections to, from, or around the first terminal and the corresponding one or more first logic pins. Such one or more first logic pins and/or one or more first nets may thus be retrieved from the first intra-connectivity.

A first bounding box may be determined at 206C for the first terminal based in part or in part on the one or more first logic pins and/or the one or more first nets by using, for example, the techniques described with reference to FIG. 2B. The same may be performed for the second terminal. More specifically, one or more second logic pins and/or one or more second nets may be identified at 208C based in part or in whole upon the second intra-die connectivity for the second terminal; and a second bounding box may be determined at 210C for the second terminal based in part or in part on the one or more second logic pins and/or the one or more second nets.

The first and second bounding boxes may be optionally brought onto the same design space at 212C for simpler operations. For example, the first bounding box in the first design space for the first electronic design may be mapped to the second design space in which the second bounding box is situated for the second electronic design in some embodiments. Similarly, the second bounding box in the second design space for the second electronic design may be mapped to the first design space in which the first bounding box is situated for the first electronic design in some other embodiments. In some other embodiments, both the first and second bounding boxes may be mapped to a temporary design space although this latter process may involve more computational resources due to mapping of both bounding boxes.

The information about the bump array or the corresponding bump pads may also be projected, mapped, or identified at 214C onto the design space that also includes the information of both bounding boxes. These techniques described herein select a bump (or a bump pad for an electronic design) and connect the first terminal in the first electronic design to the second terminal via the selected bump.

Figure 2D:
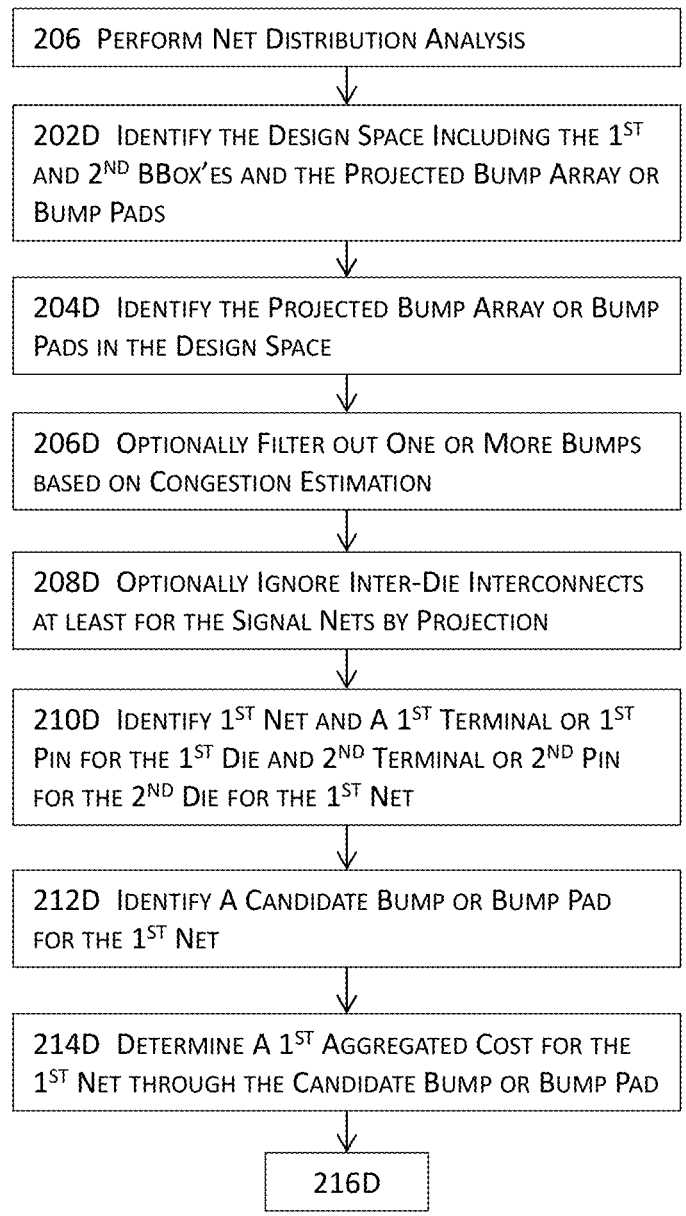
FIGS. 2D-2E jointly illustrate more details of a block illustrated in FIG. 2A in some embodiments.
Figure 2E:
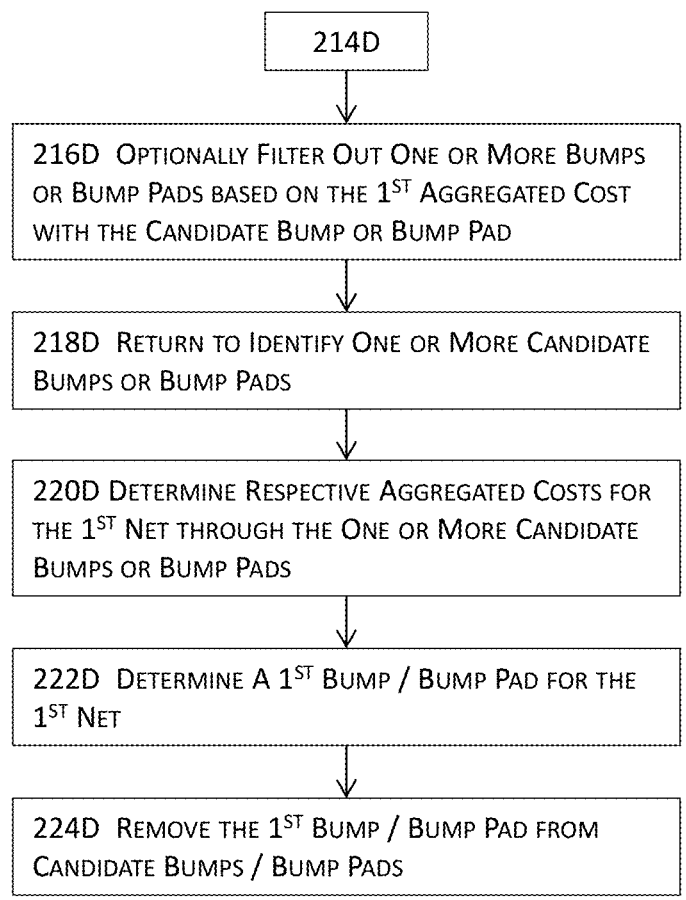

FIGS. 2D-2E jointly illustrate more details of a block illustrated in FIG. 2A in some embodiments. More specifically, FIGS. 2D-2E jointly illustrate more details about performing a net distribution analysis at 206 of FIG. 2A. In these embodiments, the design space including information about the first and second bounding boxes and the bump array (or bump pads) may be identified at 202D. As described above, the design space may include the first design space for the first electronic design, the second design space for the second electronic design, or the temporary design space other than the first and second electronic spaces. Information about the location of the bump array or the corresponding bump pads may be identified at 204D.

In some embodiments, the full geometric information for the bump array including the locations and sizes of each bump or bump pad may be identified at 204D. In some other embodiments, a reduced set of information may be identified for the bump array or the corresponding bump pads to conserve computational resources. For example, a terminal, pin, bump, bump, or net segment, which is originally a two-dimensional geometric shape, may be represented in a reduced form such as a degenerated two dimensional shape. For example, a bump pad may be reduced from a two-dimensional shape to a point (e.g., the center point of the bump pad). Although the use of reduced design data may result in reduction of resolution, such reduction of resolution may be an acceptable tradeoff in determining the interconnection between two terminals via a bump that is represented as a, for example, point.

Optionally, one or more bumps or the one or more corresponding bump pads in each electronic design may be filtered out at 206D from further processing to further conserve computational resource utilization. In some embodiments, such filtering may be performed based on, for example, congestion of one or more regions. For example, when the congestion level of a specific region reaches a certain level, routing an interconnection through this specific region may be discouraged. In this example, one or more bump pads that may be used in such routing may be filtered out from further consideration so that the total number of bumps or their corresponding bump pads is reduced. The interconnects between the first and second electronic designs may be optionally ignored at 208D to further reduce the size of data to be processed. In an example of a 3D IC, these interconnects may include the interconnects between the through silicon vias on the first and second die designs.

A first net and a first terminal or a first logic pin for the first net in the first electronic design may be identified at 210D. In addition, a second net and a second terminal or a second logic pin for the first net in the second electronic design may also be identified at 210D. The first net connects the first and second electronic design between the first terminal and the second terminal via a bump in the bump array. A candidate bump (or candidate bump pad) may be identified at 212D from the bump array for the first net. The candidate bump may be randomly identified in some embodiments or may be identified based on one or more criteria in some other embodiments.

For example, a candidate bump may be identified from a region spanning on each side of a line segment connecting the centers of the first and second bounding boxes in the design space including the first and second bounding boxes and the information about the bump array or the bump pads in some embodiments. These one or more factors may further include, for example, congestion estimation based on virtual nets (e.g., virtual signal nets, virtual power/ground nets, virtual clock network, etc.), the number or extent of congestion hotspots, global routing information, legal tracks or track patterns, designed functions of the two dies in the stack (e.g., one die may have less routing demand or more routing resource than the other die, one die may have slower nets that may be spaced more closely than the other die, etc.)

A first aggregated cost may be determined at 214D for the first net through the candidate bump or the candidate bump pad. An aggregated cost may be determined based in part or in whole upon one or more factors. These one or more factors may include, for example, the total length of the first net between the two terminals, the total length of the first net between the two terminals without accounting for the interconnections between two die designs, timing performance or information of the first net, congestion or impact on congestion in one or more regions in each of the first and second electronic designs, the characteristics of the first net (e.g., power net, signal net, etc.), the operating characteristics of the first net (e.g., clock frequency), one or more design rules and the compliance therewith or violation thereof by the first net, spacing value(s) between the first net and one or more adjacent nets, impacts on one or more design rules (e.g., via staggering rule, parallel run length rule, etc.) contributed by the first net via the candidate bump or candidate bump pad, or any combinations thereof, etc.

One or more bumps or bump pads may be optionally filtered out at 216D based in part or in whole upon the first aggregated cost determined at 214D. For example, bumps that are predicted or estimated to produce longer route segments and/or more bends may be optionally filtered out at 216D so that the total number of bumps may be reduced to further conserve computational resource utilization. The process may return at 218D to identify one or more additional candidate bumps or bump pads and determine one or more respective aggregated costs for the first net via the one or more additional candidate bumps or bump pads at 220D. These aggregated costs determined at 214D and 220D may then be compared to determine a first bump or bump pad at 222D by selecting, for example, the bump or bump pad that leads to the lowest aggregated cost. The first bump may then be optionally removed from further consideration at 224D for the determination and assignment of one or more other nets.

Figure 2F:
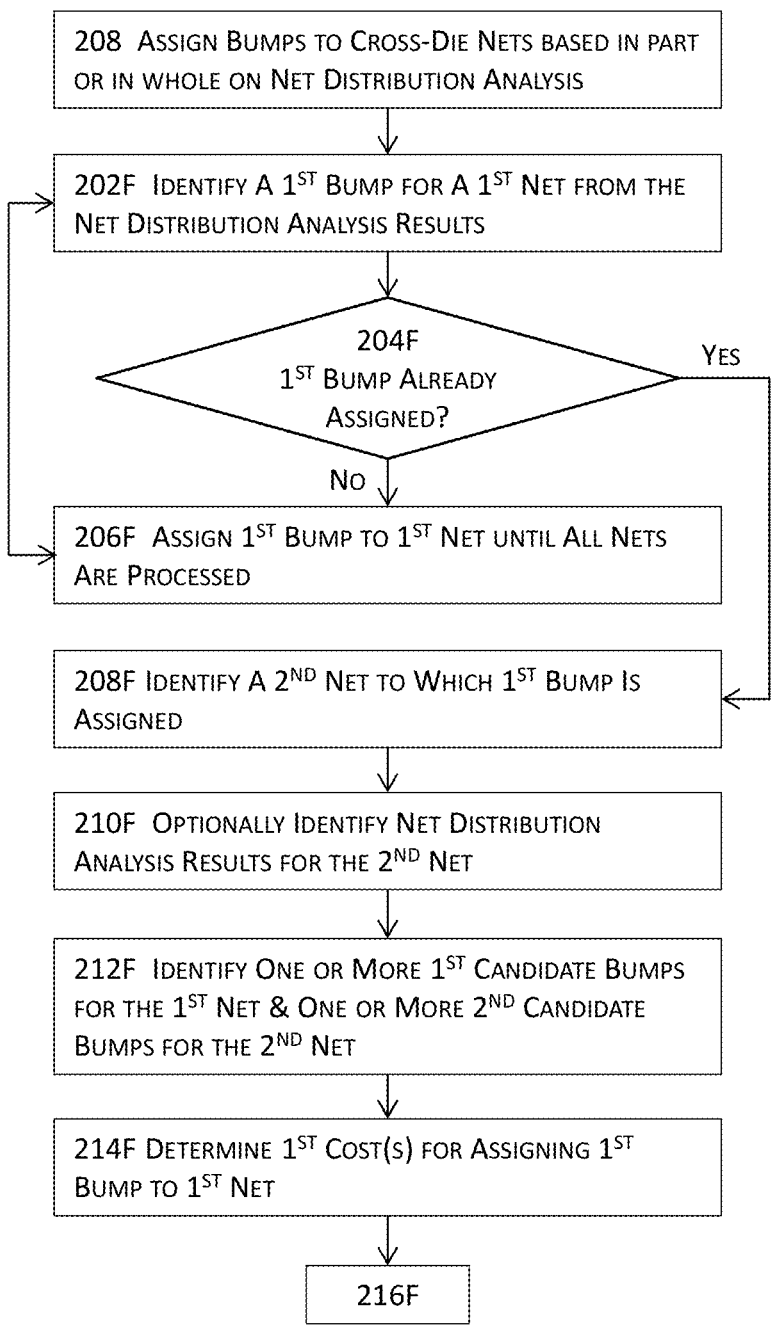
FIGS. 2F-2G jointly illustrate more details of a block illustrated in FIG. 2A in some embodiments.
Figure 2G:
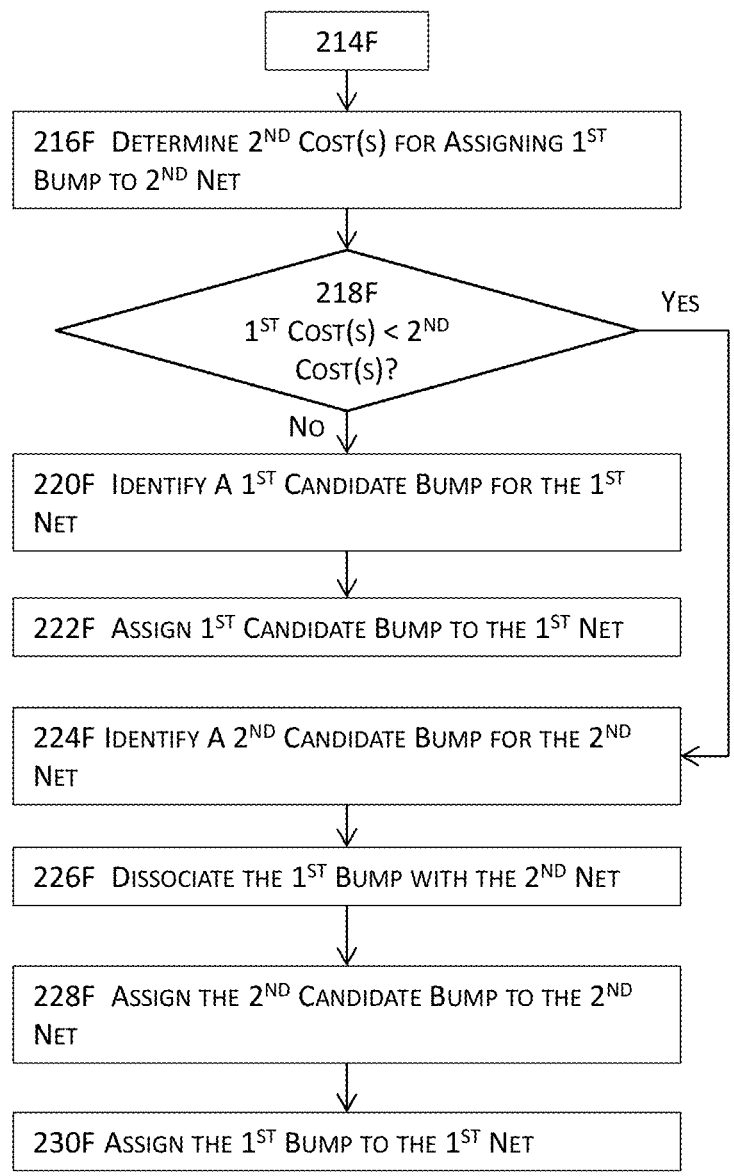

FIGS. 2F-2G jointly illustrate more details of a block illustrated in FIG. 2A in some embodiments. More specifically, FIGS. 2F-2G jointly illustrate more details about assigning bumps to nets at 208 of FIG. 2A. In these embodiments, a first bump or bump pad may be identified at 202F for the first net based in part or in whole upon the net analysis results. A determination may then be made at 204F to decide whether the first bump or bump pad has been assigned to another net. If the determination at 204F is negative, the first bump may be assigned to the first net at 206F, and the process returns to 202F to identify another bump or bump pad for another net. The process may then repeat until all nets have been assigned with respective bumps.

If the determination at 204F is affirmative, a second net to which the first bump or bump pad has been assigned may be identified at 208F. The net distribution analysis results or a portion thereof may be optionally identified at 210F for the second net. For example, the aggregated cost information of a number of candidate bumps or bump pads for the second net may be identified from the net distribution analysis results for the second net at 210F. One or more first candidate bumps or bump pads for the first net and one or more second candidate bumps or bump pads for the second net may be identified at 212F based in part or in whole upon the respective net distribution analysis results for the first and second nets.

A first aggregated cost for assigning the first bump to the first net maybe determined at 214F from the net distribution analysis results. A second aggregated cost for assigning the first bump to the second net may be further determined at 216F from the net distribution analysis results. That is, these techniques evaluate the cost of assigning the first bump to the first net and the cost of assigning the same first bump to the second net at 214D and 216D, respectively. The first aggregated cost is then compared to the second aggregated cost at 218F to determine whether the first aggregated cost is less than the second aggregated cost.

If the determination result is negative at 218F, a first candidate bump or bump pad may be identified at 220F for the first net; and this first candidate bump may be assigned to the first net at 222F. In some embodiments, the first candidate bump or bump pad is identified at 220F by selecting the candidate bump or bump pad that produces the next lowest aggregated cost than the first bump does. In these embodiments, when it is determined that assigning the first bump to the first net is more expensive (e.g., a higher first aggregated cost) than the existing assignment of the first bump to the second net, the existing assignment is not changed, and an available candidate bump (e.g., the one producing the next lowest aggregated cost for the first net) is selected from the one or more first candidate bumps or bump pads for the first net.

On the other hand, if the determination result is affirmative at 218F (e.g., the first aggregated cost is lower than the second aggregated cost), a second candidate bump may be identified at 224F from the one or more second candidate bumps or bump pads for the second net. The first bump may then be dissociated with the second net at 226F; the second candidate bump or bump pad may then be assigned to or associated with the second net at 228F; and the first bump may be assigned to or associated with the first net at 230F. In these embodiments, when it is determined that assigning the first bump, which has been assigned to the second net, results in a lowered aggregated cost, the existing assignment or association may be dissolved so that the first bump or bump pad is reassigned to the first net, and the second net is associated with a new bump (e.g., an available second candidate bump producing the next lowest aggregated cost for the second net).

Figure 3A:
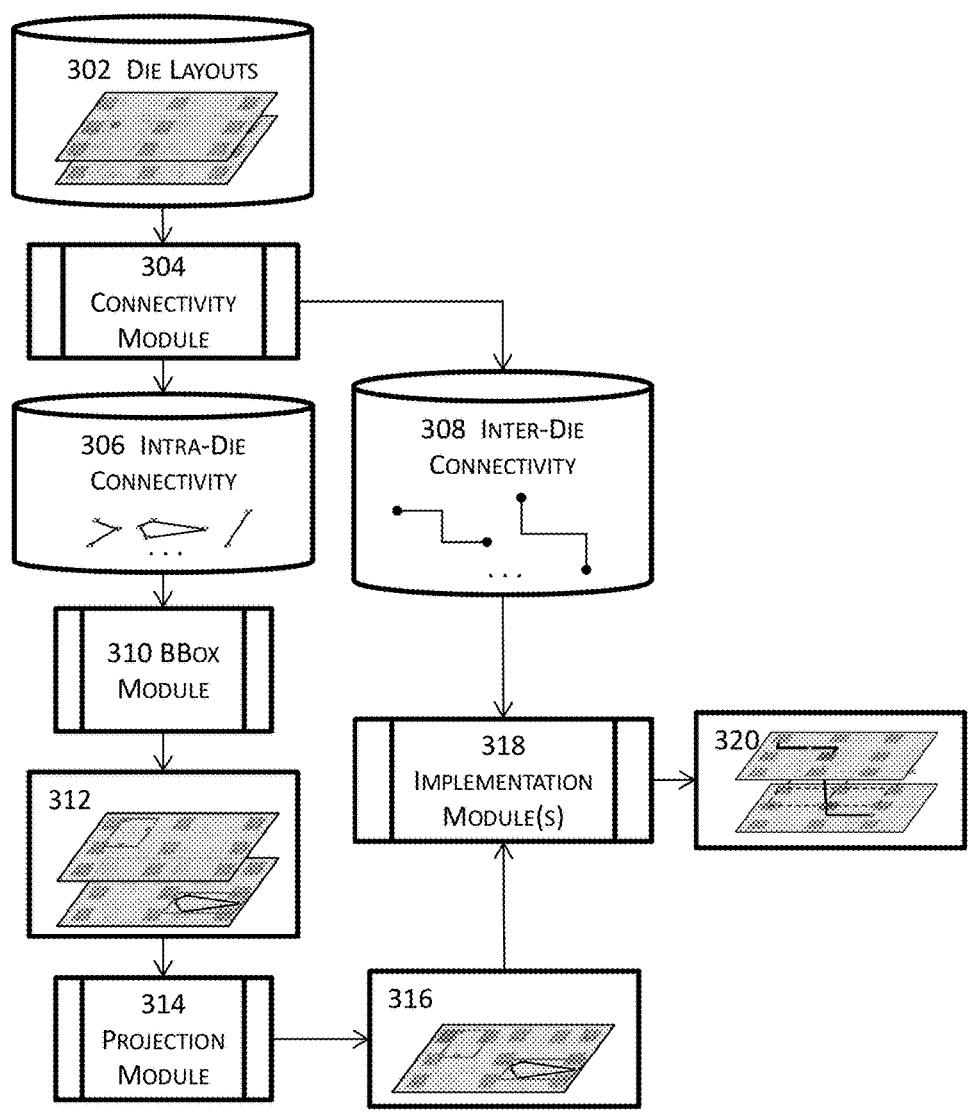
FIG. 3A illustrates another high level block diagram for implementing three-dimensional or multi-layer integrated circuit designs in one or more embodiments.

FIG. 3A illustrates another high level block diagram for implementing three-dimensional or multi-layer integrated circuit designs in one or more embodiments. These embodiments refer to 3D IC designs as an example, and an identical or substantially similar setup may also be applied to multi-layer IC designs with full and equal effects. In these embodiments, a plurality of die designs may be persistently stored in a database 302. A connectivity module 304 may process each die design in 302 to determine the intra-die connectivity 306 and inter-die connectivity 308. Either or both the inter-die connectivity 306 and intra-die connectivity 308 may be stored in one or more persistent or temporary database tables.

One or more bounding box modules 310 may reference the intra-die connectivity to construct bounding boxes for each terminal and its corresponding logic pins. For example, a bounding box module 310 may construct a first bounding box for a first terminal of a cross-die net and a second bounding box for a second terminal of the same cross-die net and store both the first and second bounding boxes 312. A projection module 314 may gather both bounding boxes in the same design space as shown in 316 by, for example, projecting one bounding box in one IC die design to the design space in which the other bounding box is located or projecting both the first and second bounding boxes to a temporary design space.

An implementation module 318 may then reference the inter-die connectivity 308 to select a bump from the bump array interfacing the first and second IC die designs and complete the interconnection between the first terminal in the first IC die design and the second terminal in the second IC die design 320.

Figure 3B:
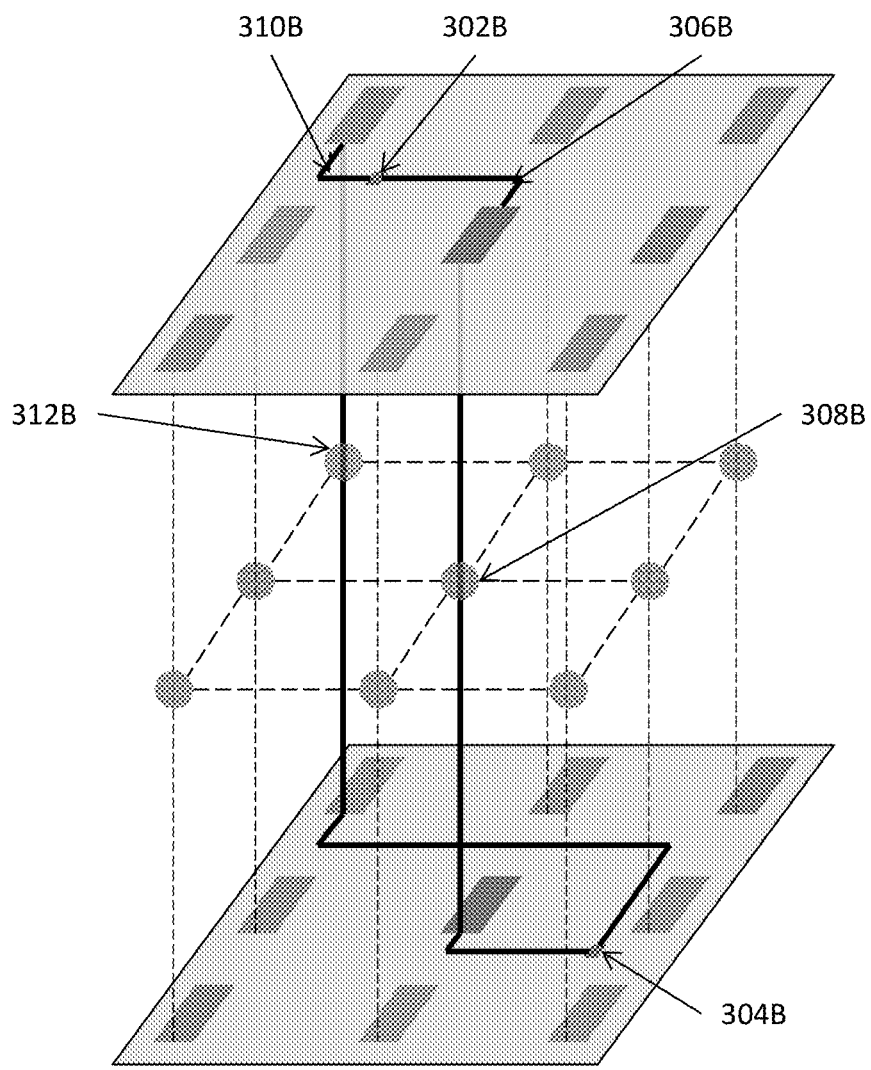
FIG. 3B illustrates a simplified example of a three-dimensional integrated circuit design interconnected via a bump array in some embodiments.

FIG. 3B illustrates a simplified example of a three-dimensional integrated circuit design interconnected via a bump array in some embodiments. In this example, these techniques implements a net connecting the first terminal 302B in the first electronic design and the second terminal 304B in another electronic design. A bump is to be selected from the bump array and assigned to the net. As FIG. 3B shows, the first terminal 302B may be connected to the second terminal 304B via a first net 306B via bump 308B or a second net 310B via bump 312B. Unlike conventional approaches, these techniques determine and select the bump and implement the net via the selected bump while considering the intra-die connectivity of both IC die designs as well as the inter-die connectivity, instead of selecting the bump with the connectivity of only one die and forcing the connection from the selected bump to the other terminal separately.

FIGS. 4A-4J jointly illustrate an example of applying certain techniques described herein to a simplified three-dimensional integrated circuit design in some embodiments. In this example, a first terminal 410A in the first electronic design 402A is to be connected to a second terminal 412A in the second electronic design 404A. Each electronic design has its own bump pads that correspond to the bumps in the bump array 406A that interfaces the first and second electronic designs. For example, the first electronic design 402A includes bump pads 414A that respectively correspond to the bumps or bump balls 408A in the bump array 406A. Similarly, the second electronic design 404A includes bump pads 416A that respectively correspond to the bumps 408A in the bump array 406A.

Figure 4A:
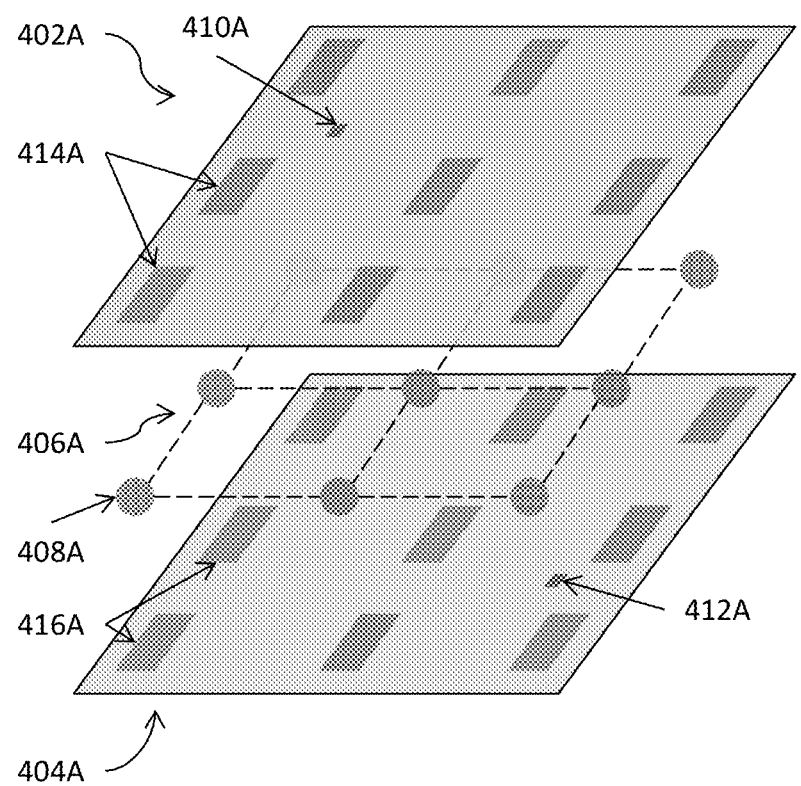
FIGS. 4A-4J jointly illustrate an example of applying certain techniques described herein to a simplified three-dimensional integrated circuit design in some embodiments.
Figure 4B:
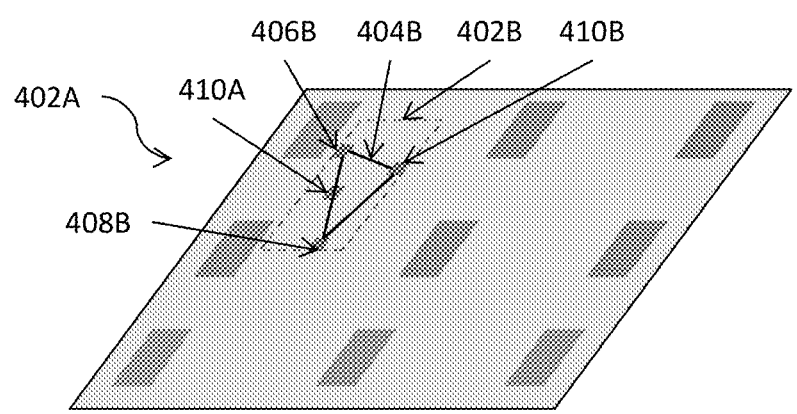

FIG. 4B illustrates an example of a first bounding box 402B constructed for the first terminal 410A in the first electronic design 402A by using techniques described above. As FIG. 4B illustrates, the bounding box 402B encloses the first terminal 410A as well as the three logic pins 406B, 408B, and 410B interconnected by net 404B. As described above, the bounding box 402B may include or be associated with the net 404C and/or the three logic pins, 406B, 408B, and 410B in some embodiments.

Figure 4C:
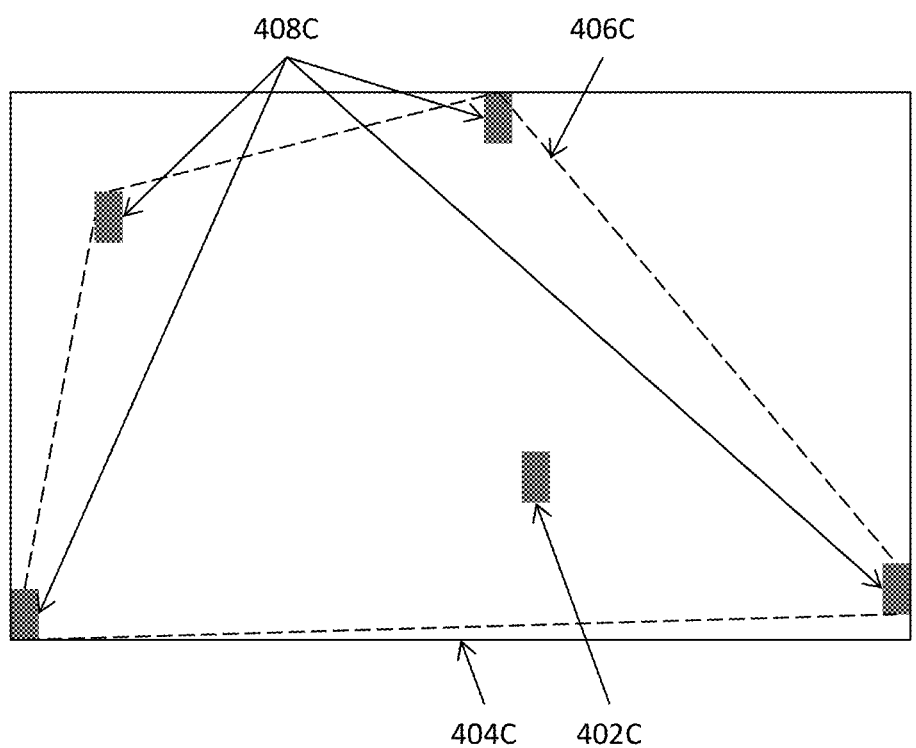

FIG. 4C illustrates two examples of bounding boxes that may be determined for a terminal. In FIG. 4C, terminal 402C corresponds to four logic pins 408C. A first bounding box 404C may be determined to include the smallest rectangle enclosing the terminal 402C and the corresponding four logic pins 406C in some embodiments. In some other embodiments, a second bounding box 406C may be determined to include the smallest polygonal shape enclosing the terminal 402C and the corresponding four logic pins 408C.

Figure 4D:
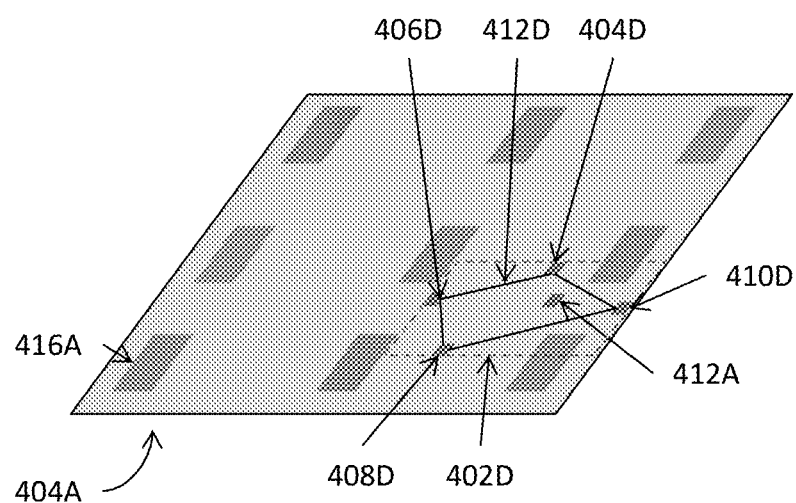

FIG. 4D illustrates an example of a second bounding box 402D constructed for the second terminal 412A in the second electronic design 404A by using techniques described above. As FIG. 4D illustrates, the bounding box 402D encloses the second terminal 412A as well as the four logic pins 404D, 406D, 408D, and 410D interconnected by net 412D. As described above, the bounding box 402D may include or be associated with the net 412D and/or the four logic pins, 404D, 406D, 408D, and 410D in some embodiments.

Figure 4E:
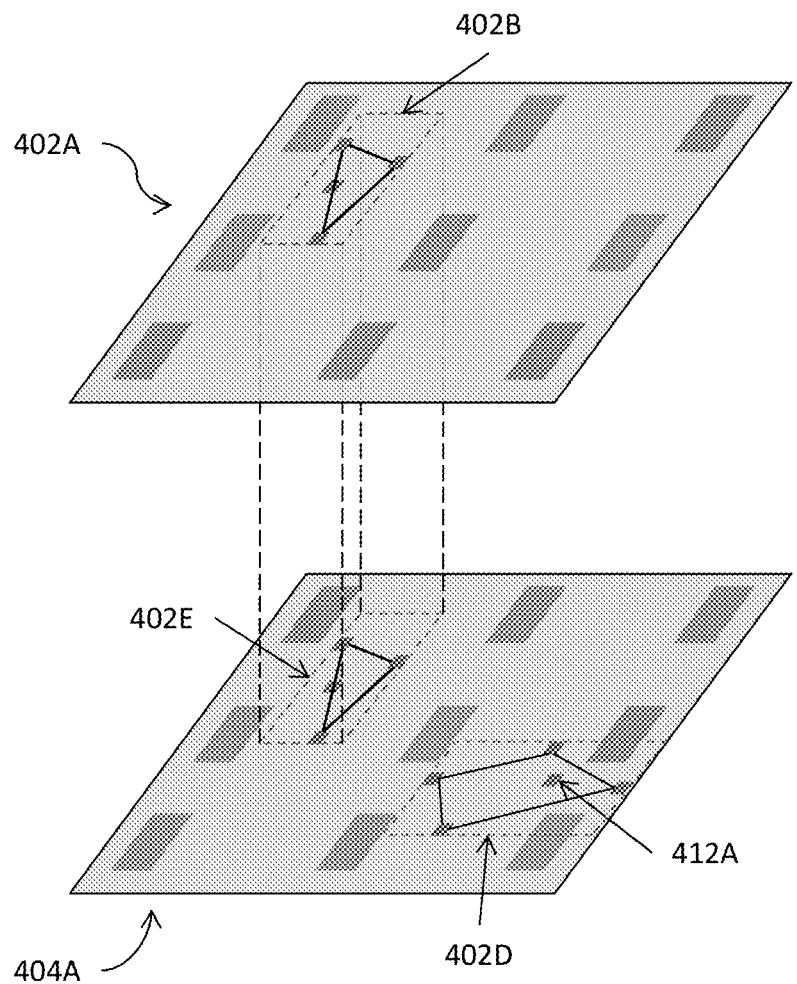

FIG. 4E illustrates an example of projecting a bounding box in one design space onto another design space in which the other bounding box is located. In this example, the first bounding box 402B for the first terminal in the first electronic design 402A is projected, mapped, or transformed into a projected, mapped, or transformed bounding box 402E in the design space in which the second bounding box 402D of the second terminal 412A of the second electronic design 404A is located.

Figure 4F:
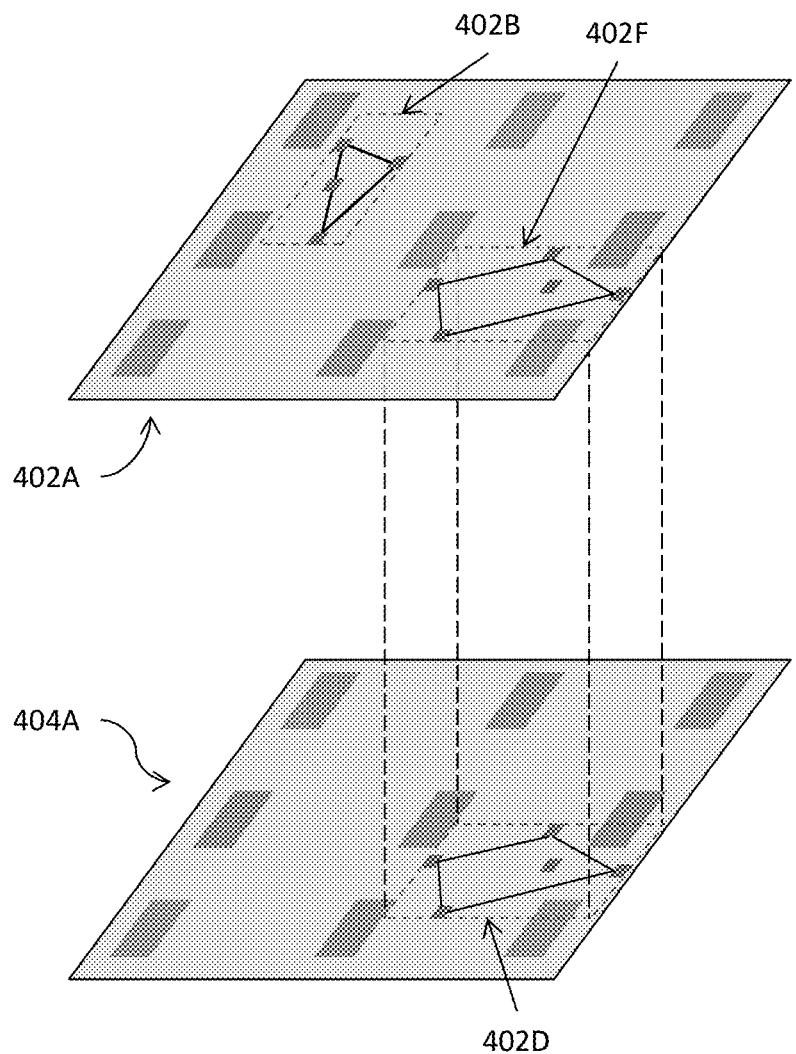

FIG. 4F illustrates another example of projecting a bounding box in one design space onto another design space in which the other bounding box is located. In this example, the second bounding box 402D for the second terminal (412A) in the second electronic design 404A is projected, mapped, or transformed into a projected, mapped, or transformed bounding box 402F in the design space in which the first bounding box 402B of the first terminal (410A) of the first electronic design 402A is located.

Figure 4G:
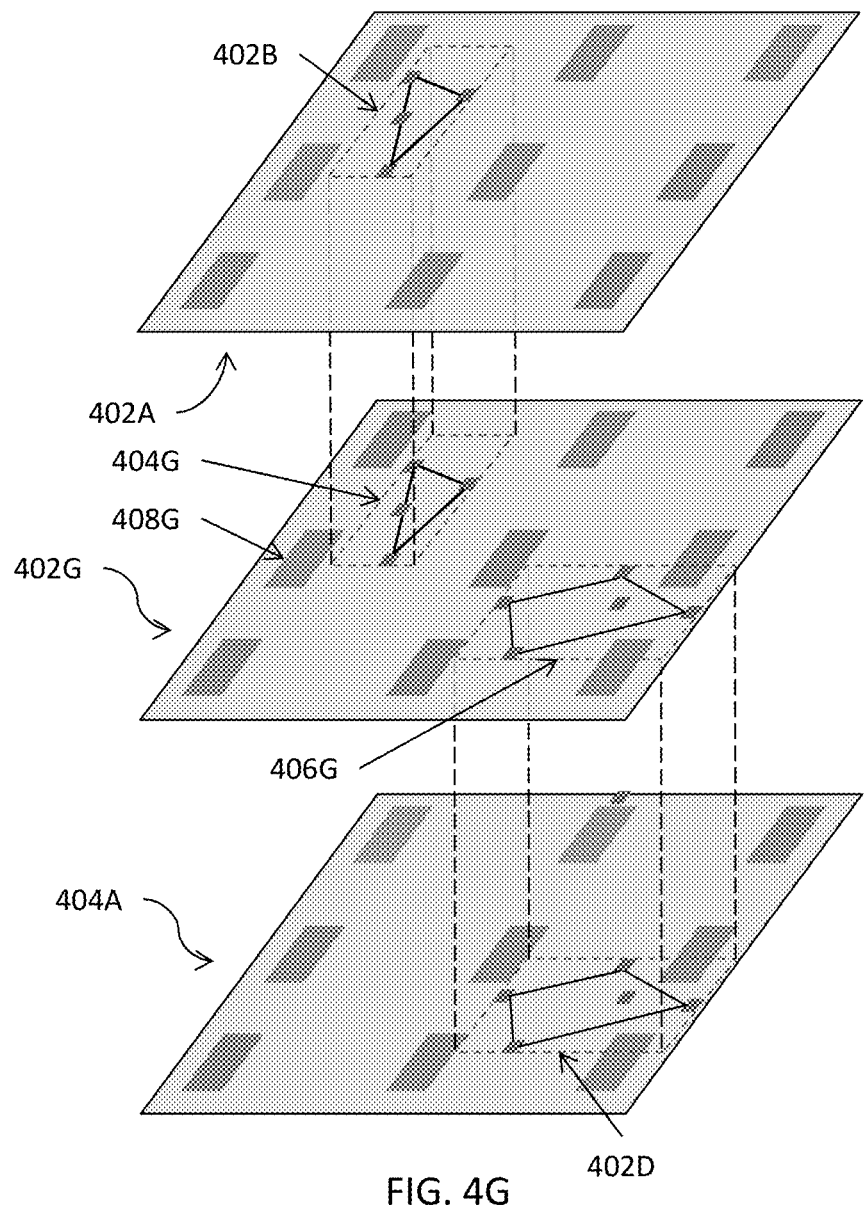

FIG. 4G illustrates another example of projecting both bounding boxes in both design spaces onto another design space such as a temporary design space. In this example, the first bounding box 402B for the first terminal in the first electronic design 402A is projected, mapped, or transformed into a projected, mapped, or transformed bounding box 404G in a temporary design space 402G. Furthermore, the second bounding box 402D for the second terminal (412A) in the second electronic design 404A is also projected, mapped, or transformed into a projected, mapped, or transformed bounding box 406G in the temporary design space 402G.

The bump pads may also be projected into projected bump pads 408G in the temporary design space 402G. In FIGS. 4E-G, a single design space including both the first and second bounding boxes as well as bump pads is constructed so that the selection of a bump and the implementation of the interconnection between the two target terminals (the first terminal 410A and the second terminal 412A) may be performed in view of the intra-die connectivity of both the first and second electronic designs.

It shall be noted that although the bounding boxes illustrated in these figures appear to include only the terminal, the corresponding logic pins, and the net segments interconnecting the logic pins and the terminal, a bounding box may include or be associated with additional information such as additional connectivity information of net or net segments in the vicinity of the terminal or any of the logic pins or even connectivity information in one or more regions further away from the terminal or its corresponding logic pins in some embodiments.

Figure 4H:
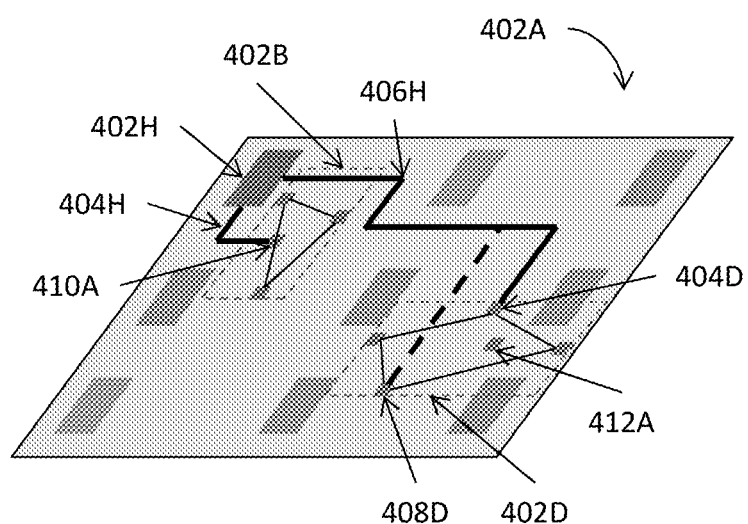

FIG. 4H illustrates an example of selecting a bump pad 402H for routing a net between the first terminal 410A and the second terminal 412A. The design space has already included information for both the first and second bounding boxes as well as the bump pads. In this example, bump pad 402H is selected, and an implementation tool may route a first net segment 404H between the first terminal 410A and the bump pad 402H as well as a second net segment 406H between the bump to the logic pin 404D or 408D of the second terminal 412A. As it can be seen from this example, selecting the bump pad 402H that minimizes the length and/or bends of route for a specific terminal (410A in this example) without considering the intra-die connectivity associated with the other terminal may result in a more complex routing solution and hence a higher aggregated cost when routing from the selected bump to the other terminal (412A in this example).

Figure 4I:
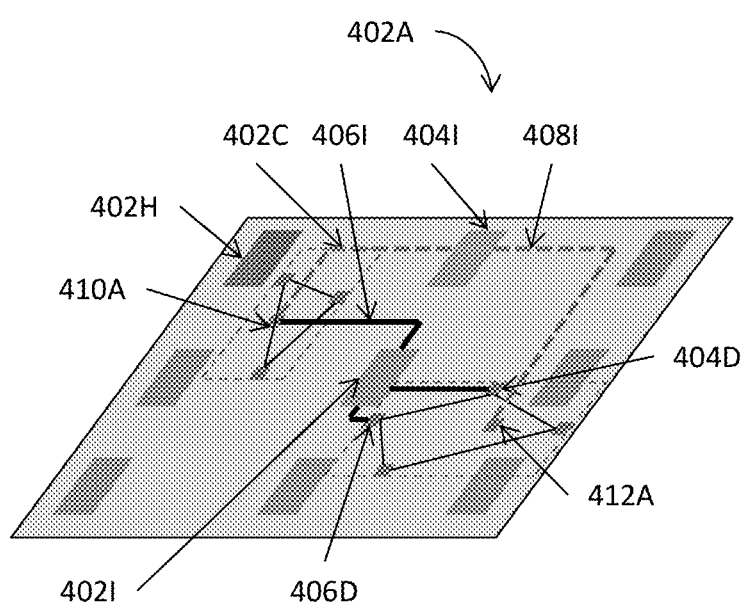
Figure 4J:
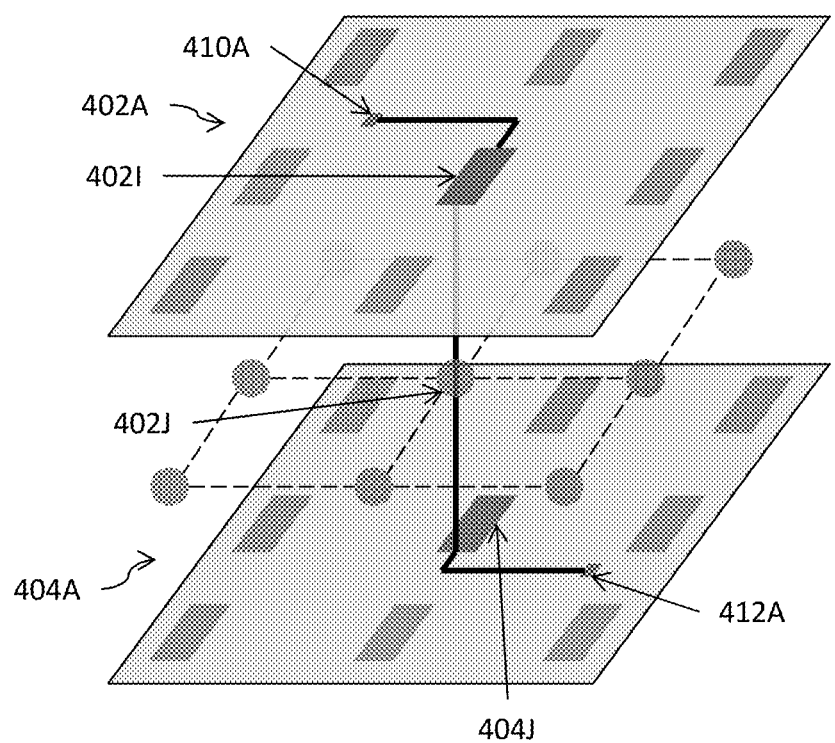

FIG. 4I illustrates an example of selecting a bump pad by referencing the intra-die connectivity for both IC die designs. In this example, rather than selecting the bump pad 402H for routing a net between the first terminal 410A and the second terminal 412A, these techniques actually perform a net distribution analysis to determine aggregated costs of interconnecting the first and second terminals via a plurality of bump pads. The available bump pad 402I that produces the lowest aggregated cost may then be selected and associated with the net interconnecting the first and second terminals. As FIGS. 4I-J illustrates, the net is routed from the first terminal 410A to the bump pad 402I, through the corresponding bump 402J in the bump array and bump pad 404J in the second IC die design, and then from the bump pad 402J to the logic pin 404D (or 406D, depending on the aggregated cost) and eventually to the second terminal 412A. Like the aforementioned example, the design space has already included information for both the first and second bounding boxes as well as the bump pads.

In determining a bump pad between two pins in two separate layers or two IC die designs, the selection of the bump pad may be determined based in part or in whole upon one or more criteria. In some embodiments, a bump pad may be selected so that the net length from the bump pad (e.g., the center of the bump pad) to one of the two bounding boxes (e.g., to the respective centers of bounding boxes 402C and 402D in FIG. 4E) is as close to the net length to from the same bump pad to the other bounding box. Although exactly equal distances between a bump pad and two bounding boxes may not necessarily be available due to the discrete distribution of the bump pads and the pins in an electronic design, these techniques may attempt to identify the bump pad that results in the closest net lengths, and thus this criterion is referred to as an equidistance criterion. In the examples provided in FIGS. 4H-4I, the bump pad 402H results in the first net length between 402H and the bounding box 402C is clearly much shorter than that between 402H and the other bounding box 402D. On the other hand, the bump pad 402I produces two net lengths from the center of the bump pad 402I to the respective centers of the two bounding boxes 402C and 402D. Therefore, bump pad 402I may be a more favorable choice than bump pad 402H when producing equidistant net lengths is the dominant criterion in the determination and selection of bump pad.

In some other embodiments, rather than calculating the net length between the center of a bump pad and a center of a bounding box, the net length may be determined as an arithmetic mean $$\left(\text{e.g., } \bar{L} = \sum_{i=1}^{N} L_i / N\right),$$

a quadric mean (e.g., $$\left(\text{e.g., } \bar{L} = \sqrt{\sum_{i=1}^{N} L_i^2 / N}\right),$$

a cubic mean $$\left(\text{e.g., } \bar{L} = \sqrt[3]{\sum_{i=1}^{N} L_i^3 / N}\right),$$

a generalized mean (e.g., $$\left(\text{e.g., } \bar{L} = \sqrt[p]{\sum_{i=1}^{N} L_i^p / N}\right),$$

or any other suitable means. In the above formulation, L denotes the mean net length, $L_i^p$ denotes the length to the p-th power of the i-th net segment between the center of a bump pad to the center of the i-th pin or terminal, and N denotes the total number of pins and/or terminals in a bounding box.

In addition or in the alternative to the equidistance criterion, a bump pad may be selected based on one or more other criteria including, for example, aggregated net lengths, estimated or predicted congestion in one or more regions near a bump pad, actual congestion in one or more regions near a bump pad, estimated or predicted increase in congestion if a net or net segment is routed through a specific bump, relative congestion of one or more sub-regions through which the route via a specific bump passes, impacts on performance (e.g., timing behavior, etc.) of the electronic design if a net or net segment is routed through a specific bump, etc.

These one or more other criteria may be applied in the alternative or in addition to the equidistance criterion. In some embodiments, these techniques may provide configurable settings to adjust the weight of the equidistance criterion and these one or more criteria. For example, the tool may include default settings that assign a full weight to the equidistance criterion and zero weight to these one or more other criteria in some embodiments. In some other embodiments, the tool may provide different sets of non-zero weights to the equidistance criterion and these one or more other criteria for different purposes. For example, for an electronic design that emphasizes performances, these weights may favor performance related criteria over the other criteria. In the example illustrated in FIG. 4H, the bump pad 402I and hence the net segments 406I in solid line type may be selected for the pins 410A and 412A based on the equidistance criterion because the bump pad 402I produces the shortest aggregated net lengths for both bounding boxes and best compromise in terms of the equidistance criterion.

On the other hand, if routing the net segments 406I is predicted to go through a region of high congestion which is also assigned a substantial weight, these techniques may select, for example, the bump pad 404I, rather than the original bump pad 402I, to interconnect pins 410A and 412A as a compromised selection based at least on the equidistance criterion and the congestion criterion. In this latter example, net segment 408I, rather than net segment 406I, will be generated in response to the selection of the bump pad 404I.

Figure 5A:
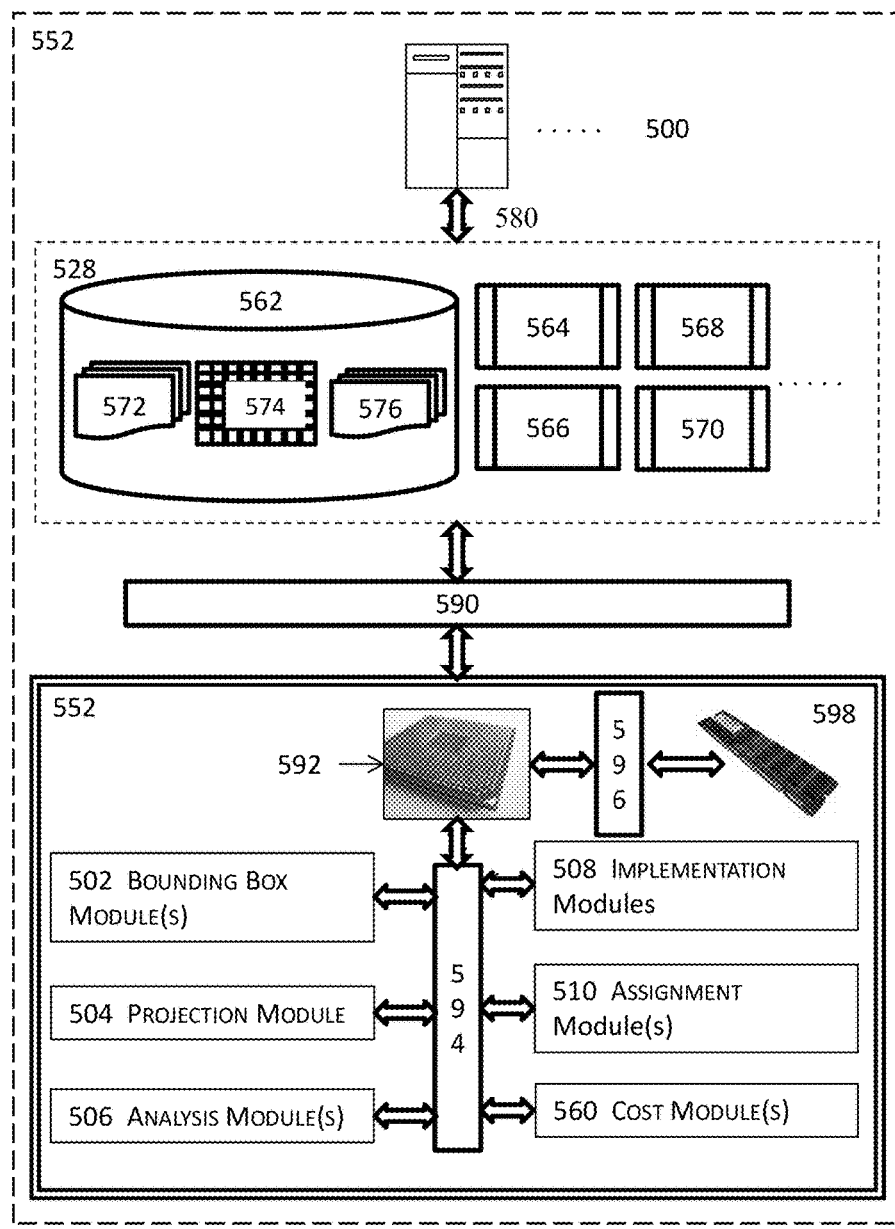
FIG. 5A illustrates a block diagram of a system for implementing three-dimensional or multi-layer integrated circuit designs in one or more embodiments.

FIG. 5A illustrates a block diagram of a system for implementing three-dimensional or multi-layer integrated circuit designs in one or more embodiments. More specifically, FIG. 5A illustrates an illustrative high level schematic block diagrams for a system for implementing three-dimensional or multi-layer integrated circuit designs and may comprise one or more computing systems 500, such as a general purpose computer described in the System Architecture Overview section to implement one or more special proposes. The illustrative system in FIG. 5A may include an Internet-based computing platform providing a shared pool of configurable computer processing resources (e.g., computer networks, servers, storage, applications, services, etc.) and data to other computers and devices in an ubiquitous, on-demand basis via the Internet. For example, one or more computing resources and/or modules illustrated in FIG. 5A may be located in a cloud computing platform in some embodiments.

In some embodiments, the one or more computing systems 500 may invoke various system resources such as the processor(s) or processor core(s), memory, disks, etc. The one or more computing systems 500 may also initiate or interact with other computing systems to access, via a computer bus architecture (e.g., a system bus, a control bus, a data bus, or any combinations thereof), various resources 528 that may comprise a floorplanner, a global routing engine, and/or a detail routing engine 564, a layout editor 566, a design rule checker 568, a verification engine 570, etc.

The one or more computing systems 500 may further write to and read from a local or remote non-transitory computer accessible storage 562 that stores thereupon data or information such as, but not limited to, one or more databases (574) such as schematic design database(s) or physical design database(s), electronic circuit design specification database(s), various statistics, various data, rule decks, various design rules, constraints, etc. (572), or other information or data (576) that may be used to facilitate the performance of various functions to achieve the intended purposes.

In some embodiments, the one or more computing systems 500 may include or, either directly or indirectly through the various resources 528, invoke a set of modules 552 including hardware modules and software modules or combinations of one or more hardware modules and one or more software modules that may comprises one or more bounding box modules 502 that determine bounding boxes for terminals by using intra-die connectivity, one or more projection modules 504 that project various information from one design space to another design space. For example, a projection module 504 may perform an orthogonal or conformal projection or mapping on a bounding box and optionally information about intra-die connectivity from one design space (e.g., a design space for a first die) to another design space (e.g., another design space for a second die) or a temporary design space in memory.

The set of modules 552 may further optionally include one or more analysis modules 506 to perform various intra-die or inter-die analyses. The set of modules 552 may also include a plurality of implementation modules 508 to perform various implementation tasks such as floorplanning, placement, routing, bump assignments and optimization, post-route optimizations, engineering change order (ECO) implementations, etc.

The set of modules 552 may also include one or more assignment modules 510 to assign bumps in a bump array to terminals in a multi-die integrated circuit design. In addition or in the alternative, this set of modules 552 may include one or more cost modules 560 to evaluate various costs of implementing a multi-die or multi-layer integrated circuit design. For example, a cost module 560 may predict or estimate the cost of assigning a particular bump in a bump array to a specific net connecting two terminals located in two separate layers or two separate dies. A cost may include, for example, a computational resource cost (e.g., memory footprint, runtime, data size, etc.) estimating or predicting the utilization of computational resources in a particular implementation, a resource utilization cost that estimates or predicts the utilization of resources (e.g., routing resource, congestion, etc.) provided by an electronic design, an estimated or predicted impact on the performance, reliability, and/or manufacturability due to a particular implementation (e.g., an assignment of a specific bump to a particular net), or any other costs that may be referenced in the execution of one or more other modules described herein.

In some embodiments, the computing system 500 may include the various resources 528 such that these various resources may be invoked from within the computing system via a computer bus 580 (e.g., a data bus interfacing a microprocessor 592 and the non-transitory computer accessible storage medium 598 or a system bus 590 between a microprocessor 592 and one or more engines in the various resources 528). In some other embodiments, some or all of these various resources may be located remotely from the computing system 500 such that the computing system may access the some or all of these resources via a computer bus 580 and one or more network components.

The computing system may also include one or more modules in the set of modules 552. One or more modules in the set 552 may include or at least function in tandem with a microprocessor 592 via a computer bus 594 in some embodiments. In these embodiments, a single microprocessor 592 may be included in and thus shared among more than one module even when the computing system 500 includes only one microprocessor 592. A microprocessor 592 may further access some non-transitory memory 598 (e.g., random access memory or RAM) via a system bus 596 to read and/or write data during the microprocessor's execution of processes.

System Architecture Overview

Figure 5B:
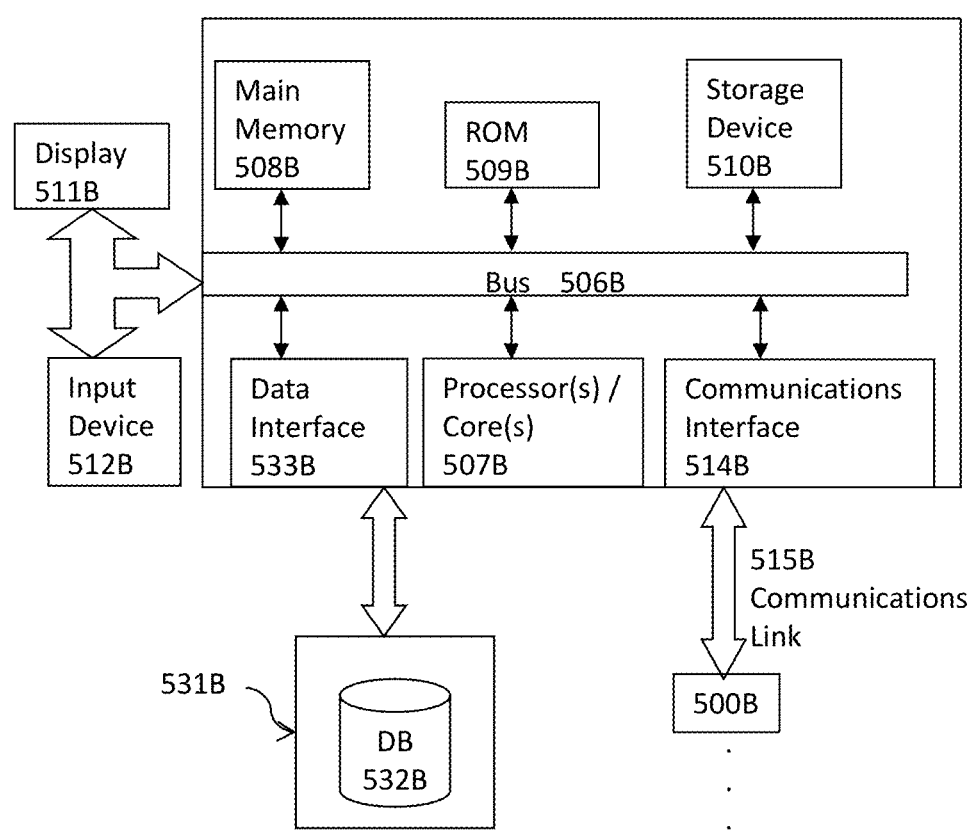
FIG. 5B illustrates a computerized system on which a method for implementing three-dimensional or multi-layer integrated circuit designs in one or more embodiments may be implemented.

FIG. 5B illustrates a block diagram of an illustrative computing system 500B suitable for implementing three-dimensional or multi-layer integrated circuit designs as described in the preceding paragraphs with reference to various figures. The illustrative computing system 500B may include an Internet-based computing platform providing a shared pool of configurable computer processing resources (e.g., computer networks, servers, storage, applications, services, etc.) and data to other computers and devices in an ubiquitous, on-demand basis via the Internet. For example, the computing system 500B may include or may be a part of a cloud computing platform in some embodiments. Computer system 500B includes a bus 506B or other communication module for communicating information, which interconnects subsystems and devices, such as processor 507B, system memory 508B (e.g., RAM), static storage device 509B (e.g., ROM), disk drive 510B (e.g., magnetic or optical), communication interface 514B (e.g., modem or Ethernet card), display 511B (e.g., CRT or LCD), input device 512B (e.g., keyboard), and cursor control (not shown).

According to one embodiment, computing system 500B performs specific operations by one or more processor or processor cores 507B executing one or more sequences of one or more instructions contained in system memory 508B. Such instructions may be read into system memory 508B from another computer readable/usable storage medium, such as static storage device 509B or disk drive 510B. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 507B, where the one or more processors, one or more processor cores, or combination thereof executes one or more threads. For example, various acts of identifying, various acts of determining, various acts of classifying, various acts of implementing, various acts of performing, various acts of transforming, various acts of decomposing, various acts of updating, various acts of presenting, various acts of modifying, etc. may be performed by one or more processors, one or more processor cores, or combination thereof.

A modules described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a module described herein may be implemented as an application-specific integrated circuit (ASIC) in some embodiments.

In these embodiments, a module may thus include, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of module. A module described herein or an equivalent thereof may perform its respective functions alone or in conjunction with one or more other modules. A module described herein or an equivalent thereof may thus invoke one or more other modules by, for example, issuing one or more commands or function calls. The invocation of one or more other modules may be fully automated or may involve one or more user inputs.

The term "computer readable storage medium" or "computer usable storage medium" as used herein refers to any non-transitory medium that participates in providing instructions to processor 507B for execution. Such a medium may take many forms, including but not limited to, non-volatile media and volatile media. Non-volatile media includes, for example, optical or magnetic disks, such as disk drive 510B. Volatile media includes dynamic memory, such as system memory 508B. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 500B. According to other embodiments of the invention, two or more computer systems 500B coupled by communication link 515 (e.g., LAN, PTSN, or wireless network) may perform the sequence of instructions required to practice the invention in coordination with one another.

Computer system 500B may transmit and receive messages, data, and instructions, including program, i.e., application code, through communication link 515B and communication interface 514B. Received program code may be executed by processor 507B as it is received, and/or stored in disk drive 510B, or other non-volatile storage for later execution. In an embodiment, the computing system 500B operates in conjunction with a data storage system 531B, e.g., a data storage system 531B that includes a database 532B that is readily accessible by the computing system 500B. The computing system 500B communicates with the data storage system 531B through a data interface 533B. A data interface 533B, which is coupled with the bus 506B, transmits and receives electrical, electromagnetic or optical signals that include data streams representing various types of signal information, e.g., instructions, messages and data. In embodiments of the invention, the functions of the data interface 533B may be performed by the communication interface 514B.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing three-dimensional or multi-layer integrated circuit designs, comprising:

identifying, with one or more connectivity modules including or coupled with at least one micro-processor of a computing system, an electronic design and a plurality of inputs for implementing connectivity for the electronic design;

reducing at least one first data structures storing the electronic design to at least one first reduced data structure based at least in part upon an identification of an interface portion between at least two layers in the electronic design;

reducing the at least one first reduced data structure into at least one second reduced data structure at least by performing one or more net distribution analyses that generate net distribution analysis results; and implementing the connectivity between multiple layers in the electronic design at least by assigning a bump in a bump array in the second reduced electronic design to a net connecting a first layer and a second layer in the electronic design based in part or in whole upon the net distribution analysis results.

2. The computer implemented method of claim 1, identifying the plurality of inputs further comprising:
   identifying a first IC (integrated circuit) die design, a second IC die design, a plurality of nets, and the bump array;
   identifying a first net from the plurality of nets;
   identifying a first terminal in the first IC die design based in part or in whole upon inter-die connectivity for the first net; and
   identifying a second terminal in the second IC die design based in part or in whole upon inter-die connectivity for the first net.

3. The computer implemented method of claim 2, identifying the plurality of inputs further comprising:
   determining a first bounding box for the first terminal based in part or in whole upon first intra-die connectivity for the first terminal and a second bounding box for the second terminal based in part or in whole upon second intra-die connectivity for the second terminal.

4. The computer implemented method of claim 3, determining the first bounding box comprising:
   identifying the first intra-die connectivity for the first terminal;
   determining one or more first logic pins and one or more first nets corresponding to the first terminal from the first intra-die connectivity; and
   determining the first bounding box for the first terminal based in part or in whole upon the one or more first logic pins and the one or more first nets.

5. The computer implemented method of claim 4, determining the second bounding box comprising:
   identifying the second intra-die connectivity for the second terminal;
   determining one or more second logic pins and one or more second nets corresponding to the second terminal from the second intra-die connectivity; and
   determining the second bounding box for the second terminal based in part or in whole upon the one or more second logic pins and the one or more second nets.

6. The computer implemented method of claim 5, determining the first bounding box and the second bounding box comprising:
   arranging the first bounding box and the second bounding box in a single design space; and
   identifying information about the bump array into the single design space.

7. The computer implemented method of claim 1, generating the net distribution analysis results by performing the one or more net distribution analyses comprising:
   identifying a single design space including the first bounding box, the second bounding box, and information about the bump array, wherein the information about the bump array comprises geometric information of a plurality of bumps in the bump array or a plurality of bump pads corresponding to the plurality of bumps;
   identifying a first net interconnecting a first electronic design in the electronic design and a second electronic design in the electronic design;
   identifying a first terminal or a first logic pin corresponding to the first terminal for the first net;
   identifying a second terminal or a second logic pin corresponding to the second terminal for the first net; and
   identifying one or more candidate bumps or one or more candidate bump pads for the first net.

8. The computer implemented method of claim 7, generating the net distribution analysis results by performing the one or more net distribution analyses comprising:
   determining respective first aggregated costs for the first net routed through the one or more candidate bumps or the one or more candidate bump pads for the first net; and
   determining a first bump or a first bump pad from the one or more candidate bumps or the one or more candidate bump pads based in part or in whole upon the respective first aggregated costs.

9. The computer implemented method of claim 8, generating the net distribution analysis results by performing the one or more net distribution analyses comprising at least one of:
   filtering out one or more second bumps from the plurality of bumps or the plurality or one or more bump pads from the plurality of bump pads based in part or in whole upon the respective first aggregated costs;
   filtering out one or more first bumps from the bump array based in part or in whole upon congestion analysis results; or
   ignoring or excluding design data pertaining to inter-die interconnects between the first electronic design and the second electronic design in the electronic design.

10. The computer implemented method of claim 1, assigning a bump in the bump array to the net comprising:
    identifying a first bump for the net from the net distribution analysis results;
    determining whether the first bump has been assigned;
    identifying the first bump to the bump in the bump array when the first bump is determined not to have been assigned; and
    assigning the bump to the first net when the first bump is determined not to have been assigned.

11. The computer implemented method of claim 10, assigning a bump in the bump array to the net further comprising:
    identifying a second net to which the first bump has been assigned when the first bump is determined to have been assigned;
    identifying the net distribution results pertaining to the second net; and
    identifying one or more first candidate bumps for the first net and one or more second candidate bumps for the second net.

12. The computer implemented method of claim 11, assigning a bump in the bump array to the net further comprising:
    determining a first aggregated cost for assigning the first bump to the first net;
    determining a second aggregated cost for assigning the first bump to the second net; and
    determining whether the first aggregated cost is less than the second aggregated cost.

13. The computer implemented method of claim 12, assigning a bump in the bump array to the net further comprising:
    identifying a first candidate bump for the first net when the first aggregated cost is determined not to be less than the second aggregated cost; and
    assigning the first candidate bump to the first net when the first aggregated cost is determined not to be less than the second aggregated cost.

14. The computer implemented method of claim 12, assigning a bump in the bump array to the net further comprising:
  identifying a second candidate bump for the second net when the first aggregated cost is determined to be less than the second aggregated cost;
  dissociating the first bump with the second net;
  assigning the second candidate bump to the second net; and
  assigning the first bump to the first net.

15. A system for implementing three-dimensional or multi-layer integrated circuit designs, comprising:
  a plurality of modules, at least one of which comprises at least one microprocessor including one or more processor cores executing one or more threads in a computing system;
  a non-transitory computer accessible storage medium storing thereupon program code that includes a sequence of instructions that, when executed by the at least one micro-processor or processor core of a computing system, causes the at least one micro-processor or processor core at least to:
  identify, with one or more connectivity modules including or coupled with at least one micro-processor of a computing system, an electronic design and a plurality of inputs for implementing connectivity for the electronic design;
  reduce the electronic design to a first reduced electronic design based at least in part upon an identification of an interface portion between at least two layers in the electronic design;
  reduce the first reduced electronic design into a second reduced electronic design at least by performing one or more net distribution analyses that generate net distribution analysis results; and
  implement the connectivity between multiple layers in the electronic design at least by assigning a bump in a bump array in the second reduced electronic design to a net connecting a first layer and a second layer in the electronic design based in part or in whole upon the net distribution analysis results.

16. The system of claim 15, wherein the program code includes further instructions that, when executed by the at least one micro-processor or processor core, cause the at least one processor or processor core to:
  identify a single design space including the first bounding box, the second bounding box, and information about the bump array, wherein the information about the bump array comprises geometric information of a plurality of bumps in the bump array or a plurality of bump pads corresponding to the plurality of bumps;
  identify a first net interconnecting a first electronic design in the electronic design and a second electronic design in the electronic design;
  identify a first terminal or a first logic pin corresponding to the first terminal for the first net;
  identify a second terminal or a second logic pin corresponding to the second terminal for the first net; and
  identify one or more candidate bumps or one or more candidate bump pads for the first net.

17. The system of claim 16, wherein the program code includes further instructions that, when executed by the at least one micro-processor or processor core, cause the at least one processor or processor core to:
  determine respective first aggregated costs for the first net routed through the one or more candidate bumps or the one or more candidate bump pads for the first net; and
  determine a first bump or a first bump pad from the one or more candidate bumps or the one or more candidate bump pads based in part or in whole upon the respective first aggregated costs.

18. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for implementing three-dimensional or multi-layer integrated circuit designs, the set of acts comprising:
  identifying, with one or more connectivity modules including or coupled with at least one micro-processor of a computing system, an electronic design and a plurality of inputs for implementing connectivity for the electronic design;
  reducing the electronic design to a first reduced electronic design based at least in part upon an identification of an interface portion between at least two layers in the electronic design;
  reducing the first reduced electronic design into a second reduced electronic design at least by performing one or more net distribution analyses that generate net distribution analysis results; and
  implementing the connectivity between multiple layers in the electronic design at least by assigning a bump in the second reduced electronic design in a bump array to a net connecting a first layer and a second layer in the electronic design based in part or in whole upon the net distribution analysis results.

19. The article of manufacture of claim 18, the set of acts further comprising:
  identifying a first bump for the net from the net distribution analysis results;
  determining whether the first bump has been assigned;
  identifying the first bump to the bump in the bump array when the first bump is determined not to have been assigned;
  assigning the bump to the first net when the first bump is determined not to have been assigned;
  determining a first aggregated cost for assigning the first bump to the first net;
  determining a second aggregated cost for assigning the first bump to the second net; and
  determining whether the first aggregated cost is less than the second aggregated cost.

20. The article of manufacture of claim 19, the set of acts further comprising:
  identifying a first candidate bump for the first net when the first aggregated cost is determined not to be less than the second aggregated cost;
  assigning the first candidate bump to the first net when the first aggregated cost is determined not to be less than the second aggregated cost;
  identifying a second candidate bump for the second net when the first aggregated cost is determined to be less than the second aggregated cost;
  dissociating the first bump with the second net;
  assigning the second candidate bump to the second net; and
  assigning the first bump to the first net.

* * * * *